United States Patent
Wang et al.

(10) Patent No.: US 6,744,805 B2
(45) Date of Patent: *Jun. 1, 2004

(54) SINGLE MODE OPERATION OF MICROELECTROMECHANICALLY TUNABLE, HALF-SYMMETRIC, VERTICAL CAVITY SURFACE EMITTING LASERS

(75) Inventors: Peidong Wang, Billerica, MA (US); Parviz Tayebati, Boston, MA (US); Daryoosh Vakhshoori, Cambridge, MA (US)

(73) Assignee: Nortel Networks Limited (CA)

( * ) Notice: Subject to any disclaimer, the term of this patent is extended or adjusted under 35 U.S.C. 154(b) by 0 days.

This patent is subject to a terminal disclaimer.

(21) Appl. No.: 10/255,401

(22) Filed: Sep. 26, 2002

(65) Prior Publication Data

US 2003/0031221 A1 Feb. 13, 2003

Related U.S. Application Data

(63) Continuation of application No. 09/543,318, filed on Apr. 5, 2000, now abandoned.

(51) Int. Cl.$^7$ .............................. H01S 3/08; H01S 3/10; H01S 5/00
(52) U.S. Cl. .............................. 372/99; 372/20; 372/45; 372/107
(58) Field of Search .............................. 372/20, 44–46, 372/99, 107

(56) References Cited

U.S. PATENT DOCUMENTS 5,115,441 A * 5/1992 Kopf et al. ................... 372/45
5,245,622 A * 9/1993 Jewell et al. ................. 372/45
5,291,502 A * 3/1994 Pezeshki et al. ............. 372/20
5,383,214 A * 1/1995 Kidoguchi et al. ........... 372/46
5,991,490 A * 11/1999 Mizuuchi et al. ........... 385/130
6,438,149 B1 * 8/2002 Tayebati et al. .............. 372/45

FOREIGN PATENT DOCUMENTS

JP 09018082 A * 1/1997 ............. H01S/3/18

* cited by examiner

Primary Examiner—Paul Ip
Assistant Examiner—James Menefee
(74) Attorney, Agent, or Firm—Steubing McGuinness & Manaras LLP

(57) ABSTRACT

A method is provided for fabricating microelectromechanically tunable vertical-cavity surface-emitting lasers with precise lateral and vertical dimensional control. Microelectromechanical tunable vertical cavity surface emitting laser structures are also provided which include a suspended membrane structure made of a dielectric/metal membrane or metal film that supports a cavity-tuning reflective dielectric film stack while being anchored at the perimeter by metal support post(s). Tuning is achieved by translational movement of the cavity-tuning reflective dielectric film stack in a controlled electrostatic field. The current invention deals with the intracavity electrical contacts for current injection for this type of MEM-tunable VCSEL's. The current invention also includes various mechanisms to control the current injection profile so as to ensure single mode operation throughout the tuning range of the MEM-tunable VCSEL's.

15 Claims, 20 Drawing Sheets

1.49" –24um aperture

40um mirror,

24um aperture 1.49" –24um aperture

40um mirror,

24um aperture

SINGLE MODE OPERATION OF MICROELECTROMECHANICALLY TUNABLE, HALF-SYMMETRIC, VERTICAL CAVITY SURFACE EMITTING LASERS

REFERENCE TO PENDING PRIOR PATENT APPLICATION

This is a continuation of prior application Ser. No. 09/543,318 filed Apr. 5, 2000 now abandoned by Peidong Wang, Parviz Tayebati and Daryoosh Vakhshoori for SINGLE MODE OPERATION OF MICROELECTROMECHANICALLY TUNABLE, HALF-SYMMETRIC, VERTICAL CAVITY SURFACE EMITTING LASER.

This patent application claims benefit of pending prior U.S. patent application Ser. No. 09/105,399, filed Jun. 26, 1998 by Parviz Tayebati et al. for MICROELECTROMECHANICALLY TUNABLE, CONFOCAL, VERTICAL CAVITY SURFACE EMITTING LASER AND FABRY PEROT FILTER, which patent application is hereby incorporated herein by reference.

This patent application also claims benefit of pending prior U.S. Provisional Patent Application Serial No. 60/146,396, filed Jul. 30, 1999 by Peidong Wang et al. for TUNABLE MICROELECTROMECHANICAL VCSEL WITH HALF-SYMMETRIC CAVITY, which patent application is also incorporated herein by reference.

FIELD OF THE INVENTION

The present invention relates to semiconductor optoelectronic devices in general and, more particularly, to wavelength tunable surface emitting semiconductor lasers.

BACKGROUND OF THE INVENTION

Tunable vertical cavity surface emitting lasers (VCSEL's) have recently generated considerable interest in the art. This is because these devices show great promise not only for increasing bandwidth during wavelength division multiplexing (WDM) in fiber-optic communications, but also for use in switches, routers, highly compact spectroscopic interferometers, optical trans-receivers and numerous other applications.

For example, in a WDM system, a single tunable laser source can be used as a rapid back-up for disaster recovery. This is because the single tunable laser source can be quickly tuned to the desired wavelength if and when an existing laser source fails.

Tunable lasers also have wide applications in optical sensors. For example, in gas sensing applications, a tunable laser may be conveniently used to detect specific gases for environmental monitoring.

VCSEL's are extremely attractive for integrated optoelectronic circuits. For one thing, they operate at a single longitudinal mode with a circular aperture, thereby providing efficient coupling to fibers. In addition, they are compact, and can be monolithically fabricated in large, dense arrays on a wafer-scale.

As a fixed wavelength light source, VCSEL's have demonstrated limited application and functionality.

Some past effort has been directed towards achieving wavelength tuning in VCSEL's by introducing refractive index changes with (1) temperature (see, for example, Berger, P. R., Dutta, N. K., Choquette, K. D., Hasnain, G., and Chand, N., "Monolithically Peltier-cooled vertical-cavity surface-emitting lasers", Applied Physics Letters, Vol. 59, No. 1, pp. 117–119, 1991; and Chang-Hasnain, C. J., Harbison, J. P., Zah, C. E., Florez, L. T., and Andreadakis, N. C., "Continuous wavelength tuning of two-electrode vertical cavity surface emitting lasers", Electron. Lett., Vol. 27, No. 11, pp. 1002–1003, 1991); or (2) carrier injection (see, for example, Gmachi, C., Kock, A., Rosenberger, M., Gornik, E., Micovic, M., and Walker, J. F., "Frequency tuning of a double-heterojunction AlGaAs/GaAs-vertical-cavity surface-emitting laser by a serial integrated in-cavity modulator diode", Applied Physics Letters, Vol. 62, No. 3, pp. 219–221, 1993).

Both of these techniques provide a tuning range of roughly 10 nm; however, this is still considerably short of the several tens of nanometer tuning range which is necessary for bandwidth-hungry WDM and dense WDM applications.

Wavelength tuning has also been achieved in edge emitting lasers by changing the cavity length, such as in external cavity laser systems, or by changing the refractive index along the cavity length, such as in DFB and DBR lasers. In external cavity lasers, tuning is achieved through mechanical rotation of external gratings and reflecting mirrors. Unfortunately, the tuning speed is slow and limited to the millisecond range. In DFB or DBR lasers, adjusting the refractive index to cover the whole EDFA range has permitted large-scale tuning on the order of 100 nm.

Adjustment of the refractive index may be achieved through heating, carrier injection and electro-optic effects. However, tuning often is quasi-continuous. To achieve the desired transmission wavelength, complicated electronics and computing algorithms must be integrated into the laser system. Additionally, device fabrication is complicated and involves numerous processing steps and selective epi-layer re-growth, thereby reducing yield and increasing costs considerably.

VCSEL's overcome the foregoing fabrication, performance and cost issues. As a result, VCSEL's are viable candidates for many real-world communications applications. VCSEL's are compatible with low-cost wafer level fabrication and characterization technologies. VCSEL's produce circularly-shaped, low-numerical-aperture output beams which may be easily coupled to fibers and other free space optics. The short cavity length of VCSEL's also ensures a single longitudinal lasing mode which is desirable for potential WDM or other wavelength addressing schemes.

Variation of the length of a Fabry-Perot cavity has been shown to be a viable technique for accomplishing wavelength tuning in VCSEL's without affecting the laser gain medium. This can be achieved in surface emitting devices by the provision of a top mirror that can be translated relative to the bottom mirror by the application of an electrostatic field. By the selective application of an electrostatic voltage to the movable mirror, the cavity length, and hence the lasing wavelength, may be tuned continuously. The ability to tune over the entire gain region, without mode hopping, is a significant benefit.

This technique has been implemented in tunable Fabry-Perot devices such as (1) filters (see, for example, Larson, M. C., Pezeshki, B., and Harris, J. S., "Vertical coupled-cavity microinterferometer on GaAs with deformable-membrane top mirror", IEEE Photonics Technology Letters, Vol. 7, pp. 382–384, 1995; and Tran, A. T. T., Lo, Y. H., Zhu, Z. H., Haronian, D., and Mozdy, E., "Surface Micromachined Fabry-Perot Tunable Filter", IEEE Photonics Technology Letters, Vol. 8, No. 3, pp. 393–395, 1996); (2)

light emitting diodes (see, for example, Larson, M. C., and Harris, J. S., "Broadly-tunable resonant-cavity light emission", Applied Physics Letters, Vol. 67, No. 5, pp. 590–592, 1995); and (3) VCSEL's (see, for example, Wu, M. S., Vail, E. E., Li, G. S., Yuen, W., and Chang-Hasnain, C. J., "Tunable micromachined vertical-cavity surface emitting laser", Electronic Letters, Vol. 31, No. 4, pp. 1671–1672, 1995; and Larson, M. C., Massengale, A. R., and Harris, J. S., "Continuously tunable micromachined vertical-cavity surface emitting laser with 18 nm wavelength range", Electronic Letters, Vol. 32, No. 19, pp. 330–332, 1996).

For VCSEL's to qualify for use in telecommunications applications, single-mode operation is essential. Achieving single-mode operation is difficult in conventional VCSEL's with flat DBR structures where the large lateral dimension of the device allows excitation of higher order spatial modes. Typically, obtaining single, fundamental spatial mode operation in a conventional VCSEL is achieved by decreasing the dimensions of the current injection area of the device, index guiding by lateral oxidation, etched mesa formation, or re-growth. These techniques are difficult to implement in more complicated structures such as microelectromechanically tunable VCSEL's.

Providing uniform current injection significantly improves the ability to achieve single-mode laser operation.

One technique for achieving uniform current injection is to provide doped cladding layers that urge the charge toward the aperture. Another technique is to provide a barrier layer on the cladding layer.

SOME ASPECTS OF THE PRESENT INVENTION

This patent application claims benefit of pending prior U.S. patent application Ser. No. 09/105,399, filed Jun. 26, 1998 by Parviz Tayebati et al. for MICROELECTROMECHANICALLY TUNABLE, CONFOCAL, VERTICAL CAVITY SURFACE EMITTING LASER AND FABRY PEROT FILTER, which document is hereby incorporated herein by reference.

This patent application also claims benefit of pending prior U.S. Provisional Patent Application Serial No. 60/146,396, filed Jul. 30, 1999 by Peidong Wang et al. for TUNABLE MICROELECTROMECHANICAL VCSEL WITH HALF-SYMMETRIC CAVITY, which document is also incorporated herein by reference.

The present invention addresses the single mode operation issues in this novel, microelectromechanically (MEM) tunable, half-symmetric, vertical cavity surface emitting laser (VCSEL).

The present invention also includes another innovation for producing, via micromachining, a half-symmetric cavity VCSEL that comprises a tunable cavity formed between a set of planar DBR's and a set of curved DBR's. Curvature in the DBR's is achieved by the judicious introduction of an appropriate magnitude of strain in the deposited layers. By the creation of a half-symmetric microcavity, the spatial mode and divergence of the laser mode can be controlled precisely so as to (a) produce single spatial modes by optically restricting the lasing domain in the gain region, and (b) manipulate the divergence angle of the VCSEL so as to optimize the coupling of generated light into a single mode fiber.

The fabrication techniques of the present device provide extremely precise control of the physical dimensions of both the top DBR structure and the supporting structure, which is indispensable for achieving highly reproducible performance with inconsequential device-to-device variation.

The present invention also provides for tuning the resonance wavelength of the Fabry-Perot cavity in a continuous fashion over a wide wavelength range. This ensures not only single-longitudinal operations, but also single spatial (transverse) mode ($TEM_{oo}$) operations over the entire tuning range. Furthermore, such single spatial mode ($TEM_{oo}$) operations are maintained in the entire current range in which the invention functions.

A half-symmetric tunable VCSEL device is depicted in FIG. 1. This device operates at a single longitudinal mode over the entire bandwidth (e.g., 30–120 nm) of the gain medium.

In the VCSEL, a gain medium, consisting of multiple quantum wells, is disposed in the air cavity as shown in FIG. 1. The VCSEL can be photo-pumped, or intra-cavity electrical interconnections can be made for current injection.

The current invention deals particularly with the intra-cavity electrical interconnections for current injection tunable VCSEL's. Of course, it is also to be appreciated that the tunable VCSEL can be formed with a top distributed Bragg reflector having a planar configuration, without departing from the scope of the present invention.

The following is a list of some technological breakthroughs resulting from the present invention.

Wavelength Tunable VCSEL's

A schematic diagram of the steps used in fabricating a novel wavelength tunable VCSEL based on the present invention is shown in FIG. 2 (i.e., FIGS. 2A–2G). The device comprises bottom DBR's consisting of high index-contrast dielectric pairs such as $Si/Al_2O_3$, $Si/SiO_2$, $Si/MgO$, $TiO_2/SiO_2$, or $SiO_2$ ($Ta_2O_5$, or $Nb_2O_5$) along with selectively-deposited top DBR mirrors, with an air-cavity and an active medium embedded in the Fabry-Perot cavity formed by the two DBR's.

The present invention also accommodates a hybrid mirror system such as bottom epitaxially grown DBR's and top deposited DBR's.

The top DBR resides on a thin, supporting membrane or multiple tether structure made of $Si_3N_4$ or metal (TiW) that is supported at its perimeter by a thicker metal support (see FIGS. 3A–3C). This forms a trampoline type of structure. In the case of a circular membrane structure, radially extending openings in the $Si_3N_4$ or metal film (TiW) are used for selectively removing an underlying sacrificial layer during the top DBR release process, as will be discussed further below.

By applying an appropriate voltage across this membrane and the bottom DBR's, the trampoline structure, along with the top mirror, can be translated toward, and away from, the bottom DBR so as to tune the laser emission. Since the DBR's are broad band, tuning is possible over the entire bandwidth of the laser gain spectrum, which is nominally about 60 nm.

One of the important features of the present device is that the new fabrication process provides precise control over the lateral dimensions of the trampoline structure and the air-cavity length, both of which are important for the consistent manufacturing of substantially identical devices. This is made possible in the present invention by allowing the sacrificial layer to act as a die in order to define the lateral dimensions of the trampoline structure and the vertical dimension of the air-cavity. As a result, the possible ill effects of uncontrolled dimensions, ensuing during the selective removal of the sacrificial layer, are effectively eliminated.

In addition, the new devices are small and compact (approximately 500 $\mu$m×500 $\mu$m), thereby allowing arrays thereof to be manufactured and coupled to fibers.

Tunable VCSEL With Half-Symmetric Cavity

It is well known that the Rayleigh range, $z_0$, which defines the distance at which the wave front is most curved, is related to mirror curvature, R, and cavity length, d, by the equation $z_0 = [(R-d)/d]^{1/2}$ ("Equation 1"). For instance, a resonator with a cavity length of 1.5 microns, and a radius of curvature of 1.5 millimeter for the curved DBR's, leads to a $z_0$ value of 150 microns, and to a fundamental mode beam waist, $W_0$, of 8.5 microns at a wavelength, $\lambda$, of 1.5 microns, according to the relationship $W_0 = (z_0 \lambda/\pi)^{1/2}$ ("Equation 2"). Since the value of the mode size at position z is given by the equation $W(z) = W_0[1+(z/z_0)^2]^{1/2}$ ("Equation 3"), and since $z_0$ is approximately a hundred times larger than the cavity length, the mode size remains virtually the same over the length of the cavity. Consequently, light from a 9-micron-core, single-mode fiber on the input side can excite this fundamental mode, and the transmitted single mode beam can be efficiently coupled to a single-mode fiber. As such, by curving the mirror, the mode spot size can be adjusted to match that of a single mode fiber without requiring a lens. The tradeoff is, however, that in this case the fiber has to be positioned within 0.5 micron (in the lateral direction) with respect to the optical axis of the cavity in order to avoid exciting undesirable higher order Hermite-Gaussian modes. In order to improve the alignment tolerance of the coupling fiber, a thermally expanded core fiber with mode size of 20–50 microns can be used in conjunction with mirrors with appropriately reduced curvature. The curvature R of the mirror is adjusted based on Equations 1–3 above to match the mode size $W_0$ of the thermally expanded core fiber. Because of the larger size of the Gaussian mode, the lateral positioning of the fiber is relaxed.

This design is distinctly different from the single-crystal, parallel mirror resonator design disclosed in U.S. Pat. No. 4,825,262, issued Apr. 25, 1989 to Stephen R. Mallinson.

The processing steps for the fabrication of a novel MEM tunable VCSEL with a half-symmetric cavity of the present invention are similar to those utilized in the fabrication of a novel planar cavity tunable VCSEL of the present invention. A significant difference is in the deposition of the curved DBR's. Control of the magnitude and type of strain in the deposited multilayer dielectric stack of DBR's, and the supporting thin silicon-nitride membrane, is carefully engineered so as to achieve the desired mirror curvature. The magnitude and the type of strain (tensile or compressive) is introduced in these films by the judicious choice of deposition parameters, such as the ratio of the gas mixtures of silane ($SiH_4$) and ammonia ($NH_3$), the total pressure of the gases used, and the magnitude of RF power used. The resulting stress gradient between the tensile strained silicon-nitride membrane and the compressively strained dielectric mirror stacks results in a concave DBR. Further control of the curvature of the top DBR can be achieved by introducing a stress gradient within the mirror layers by a gradual change of temperature and/or deposition voltage. Alternative methods for introducing the desired stress gradient within the mirror layers include the use of a secondary ion source to selectively modify the stress within each layer of the mirror by varying the current or voltage. In one example, a silicon nitride layer of 0.5 micron thickness, with 100 MPa of tensile stress, was deposited by PECVD, and the top mirror was deposited at 100° C. using ion-beam sputtering at 700V. The resulting mirror curvature of approximately 1 mm was achieved following removal of the sacrificial layer. Furthermore, varying the temperature of the substrate during the mirror deposition from room temperature to 120° C. resulted in a further stress gradient in the mirror layers, decreasing the mirror curvature to 0.75 mm.

In the tunable VCSEL, the gain medium resides inside the Fabry-Perot cavity defined by a set of planar DBR's and a set of movable curved DBR's, as shown in FIG. 1. Excitation of the gain medium by the fundamental mode leads to laser emission of a single, circular spatial mode. As a result, lateral optical mode confinement arises naturally, without having to form a lateral waveguide. This results in highly efficient VCSEL's.

Improved Single Mode Operation Through Uniform Current Injection

FIG. 4 shows a VCSEL configured according to the principles of the present invention, in which the spatial mode of laser oscillation is controlled by controlling the transverse optical mode. By forming a half-symmetric resonator cavity structure, the areas of gain medium subject to lasing action is limited to a well-defined eignmode with reduced lateral dimensions at the center of the aperture. Due to the properties of the curved top mirror, the lateral dimensions of the laser oscillations can be reduced to a few microns, forcing the laser to oscillate in a single, fundamental spatial mode. For a given air gap cavity L and a desired spot size Wo, the desired radius of curvature R is determined by:

$$L(R-L) = (\pi Wo^2/\lambda)^2$$

For example, a tunable VCSEL operating in the 980 nm range with an air gap cavity length of approximately 3 $\mu$m and spot size of 3 $\mu$m has a radius of curvature of approximately 330 $\mu$m.

The spacing between modes of such optical cavity can be approximated by the equation:

$$\Delta\lambda = \lambda^3/(2\pi^2 Wo^2)$$

This formula indicates that by decreasing the radius of curvature, the spot size will decrease and the energy spacing between modes will increase. For example, by reducing the mode size from 10 $\mu$m to 3 $\mu$m, the spacing between modes increases from 0.3 nm to approximately 3 nm. Since higher order modes with large spacing between modes have less overall overlap with the corresponding injection profile and sustain more diffraction loss, proper design will result in a VCSEL that lases mainly in the fundamental mode of the cavity.

In order to achieve such fundamental mode operation, extremely uniform current injection is needed so as to ensure sufficient gain at the center of the aperture, where the mode is determined by the half-symmetric cavity. Furthermore, in order to prevent high-order modes from lasing, the size of the aperture must be controlled such that high-order modes sustain high losses, thus promoting only fundamental-mode lasing. In addition, the top cladding and contact layer should also be sufficiently thin so as to ensure sufficient tuning of the VCSEL. By way of example but not limitation, in one preferred form of the invention, the top cladding and contact layer should be on the order of 300 nm.

Competing Technologies

Currently, there are fixed-wavelength VCSEL's commercially available below 1.0 $\mu$m.

There have been some reports of tunable LED's and VCSEL's. For example, Larson et al. have published results on (1) an LED (see, for example, Larson, M. C., and Harris, J. S., "Broadly-tunable resonant-cavity light emission", Applied Physics Letters, Vol. 67, No. 5, pp. 590–592, 1995); and (2) a VCSEL (see, for example, Larson, M. C., Massengale, A. R., and Harris, J. S., "Continuously tunable micromachined vertical-cavity surface emitting laser with 18 nm wavelength range", Electronic Letters, Vol. 32, No. 19, pp. 330–332, 1996).

These results indicate that Larson et al. used GaAs/AlAs for bottom DBR's, and a gold-coated silicon-nitride membrane as the top mirror. In all of the foregoing Larson et al. devices, the top mirror release is accomplished by selectively wet-etching an underlying sacrificial layer of GaAlAs with hydrochloric acid. Since this technique provides no controlled way of undercutting, the length of the support structure for the top mirror is not well defined from device to device. Furthermore, since the top mirror in Larson et al. has lower bandwidth and reflectivity than the dielectric DBR's of the present invention, the tuning range of the devices of Larson et al. is limited, and their spectral linewidth is broader than that provided by the present invention.

Similarly, Tran et al. have shown an LED (see, for example, Christenson, G. L., Tran, A. T. T., Zhu, Z. H., Lo, Y. H., Hong, M., Mannaerts, J. P., and Bhat, R., "Long-Wavelength Resonant Vertical-Cavity LED/Photodetector with a 75-nm Tuning Range", IEEE Photonics Technology Letters, Vol. 9, No. 6, pp. 725–727, 1997); the aforementioned LED using polyimide as the sacrificial layer. This method suffers from the same lack of control over precise length fabrication. In addition, polyimide is not a stable material for making a robust device, because aging tends to degrade the stability of the cavity's length.

A tunable VCSEL (see, for example, Vail, E. C., Li, G. S., Yuen, W. and Chang-Hasnain, C. J., "High performance micromechanical tunable vertical-cavity surface-emitting lasers", Electronic Letters, Vol. 32, No. 20, pp. 1888–1889, 1996) has been reported by Vail et al. The Vail et al. device uses GaAs/AlAs for the top and bottom DBR's, with a GaAs sacrificial layer for top DBR release. Although Vail et al. use a dry-etching technique to selectively remove the sacrificial GaAs layer, precise control of the top mirror length is still not feasible.

The present invention is distinct from the aforementioned devices in the following aspects, among others:

1. the present invention provides a precise method for defining the lateral dimensions of the top mirror support and the cavity length by deposited supporting posts;
2. the half-symmetric design of the VCSEL structure allows single spatial modes, lower threshold and efficient coupling into a single mode fiber; and
3. the present invention provides a method for improving single mode operation of the VCSEL through uniform current injection.

BRIEF DESCRIPTION OF THE DRAWINGS

The description of the present invention is intended to be considered in conjunction with the drawings, wherein like elements are referred to by like reference numerals throughout, and further wherein.

FURTHER ASPECTS OF THE INVENTION

Figure 1:
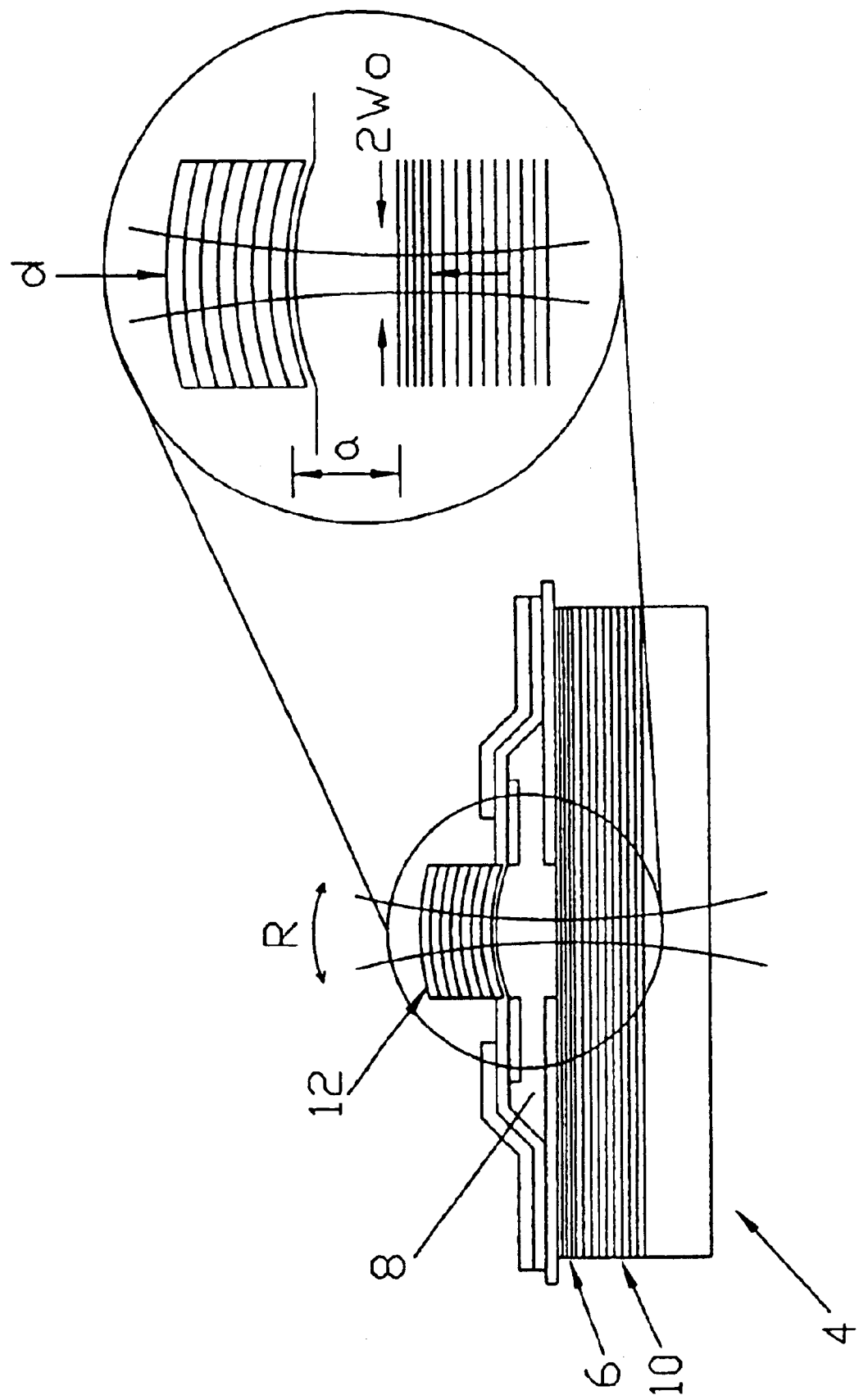
FIG. 1 is a side elevational view, in cross-section, schematically and diagrammatically illustrating a tunable vertical cavity surface emitting laser (VCSEL) having a half-symmetric cavity.

Looking now at FIG. 1, tunable VCSEL 4 includes a gain medium 6, usually comprising multiple quantum wells, located in a mechanically tunable high-Q Fabry-Perot cavity 8 formed by a pair of spaced-apart DBR's 10 and 12, respectively. In the present invention, one of the DBR's 12 can be translated towards the other of the DBR's 10 by an applied electrostatic field. This changes the Fabry-Perot cavity length, and provides tuning in the emission wavelength. The VCSEL can be photo-pumped, or charge-injection may be accomplished by intra-cavity electrical interconnections. The present invention deals particularly with the intra-cavity electrical interconnections for current injection tunable VCSEL's.

If desired, the top DBR 12 can be formed with a curved configuration, so as to form a half-symmetric VCSEL (see FIG. 1).

Device Fabrication

In FIG. 2, schematic cross-sectional views of the fabrication steps used in making microelectromechanical, tunable VCSEL's is shown.

Figure 3A:
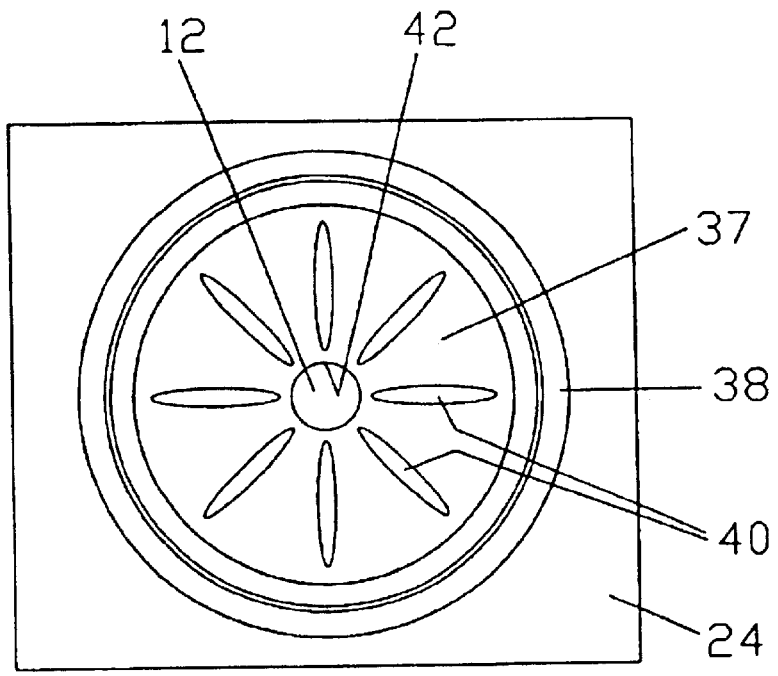
FIGS. 3A–3C show top elevational diagrammatic views of three different forms of the tunable VCSEL device, with FIG. 3A showing a membrane type structure, FIG. 3B showing a four tether device structure, and FIG. 3C showing a three tether device structure.
Figure 3B:
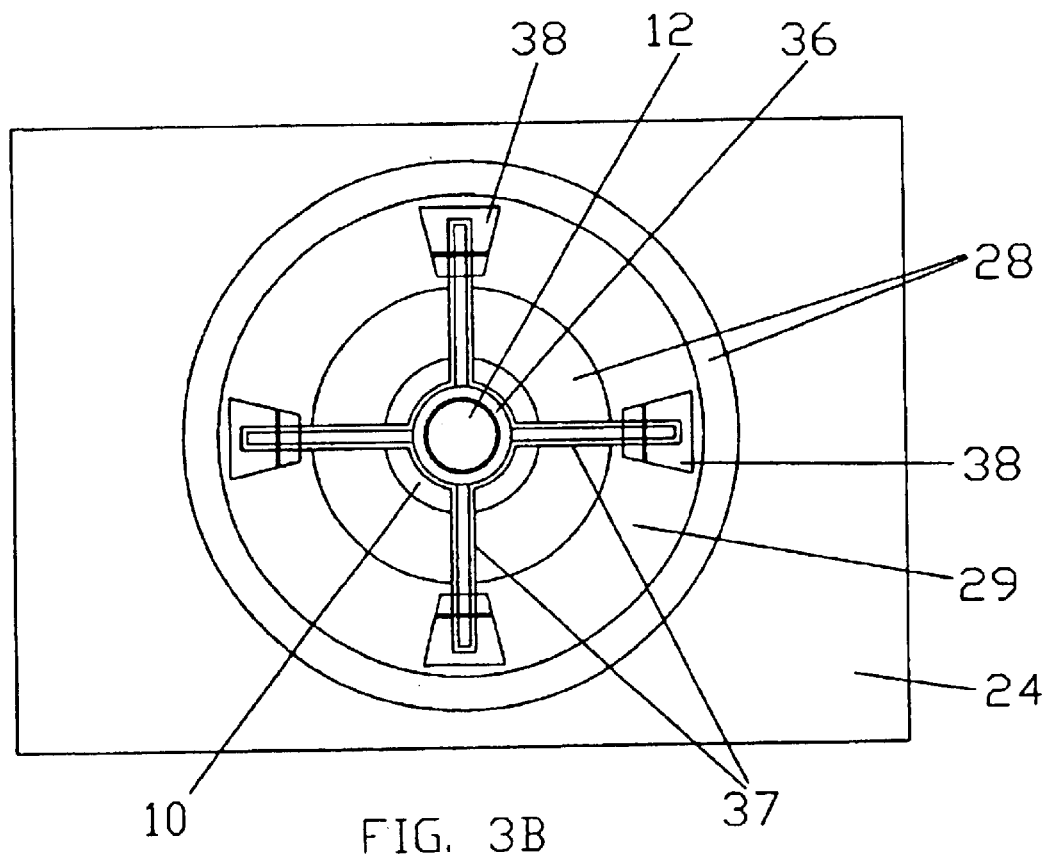
Figure 3C:
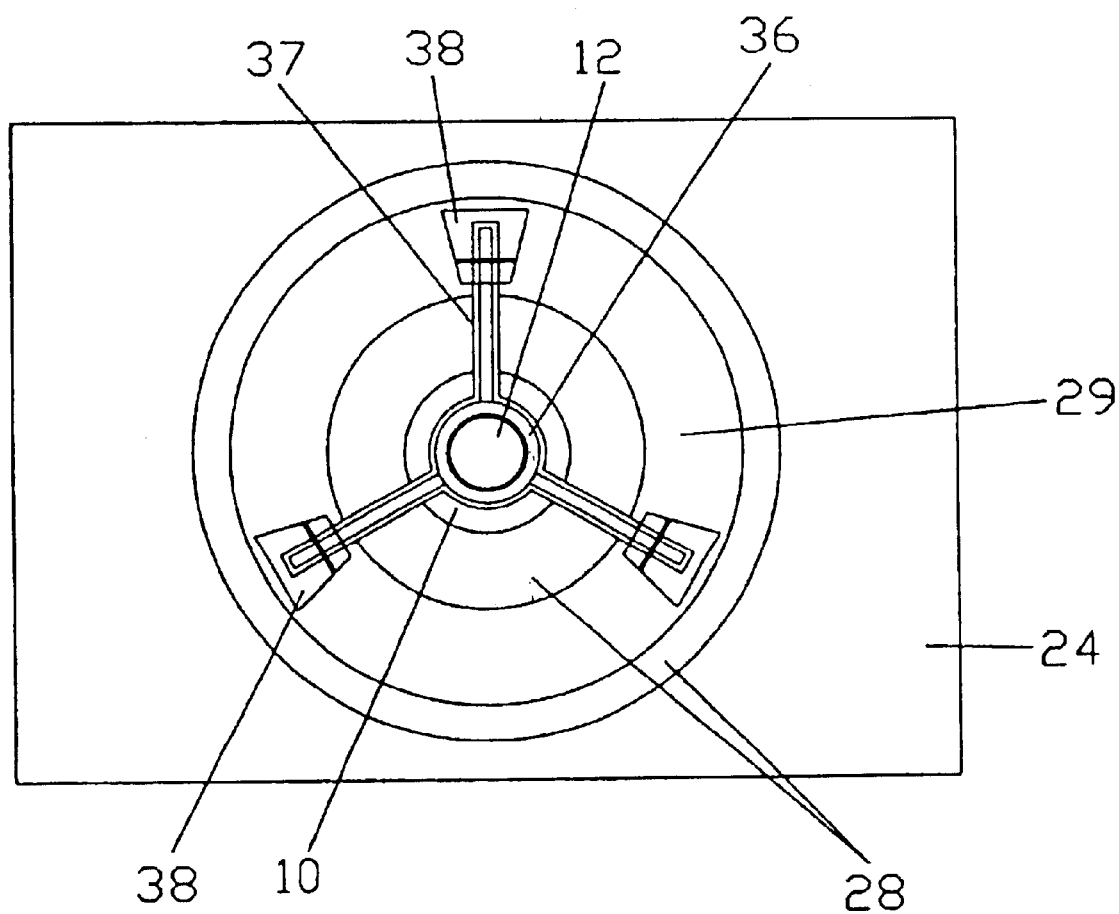

A schematic top view of three embodiments of the tunable VCSEL structure is depicted in FIGS. 3A–3C.

MEM Tunable VCSEL Fabrication Procedure

1. When fabricating a tunable VCSEL, DBR's 10 are deposited on top of the MQW structure 6. The MQW structure 6, with the DBR's 10 deposited thereon, is applied to a suitable temporary substrate 20, such as silicon, GaAs or sapphire. This is accomplished by a method such as flip-chip bonding, fusion bonding or Van der Waals bonding (see FIG. 2A).

Figure 2A:
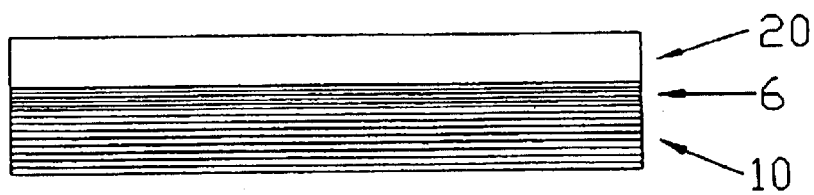
FIG. 2 (i.e., FIGS. 2A–2G) comprises a series of side elevational, diagrammatic, cross-sectional views schematically illustrating the fabrication procedure for making a microelectromechanical, tunable, vertical cavity surface emitting laser (VCSEL)
Figure 2B:
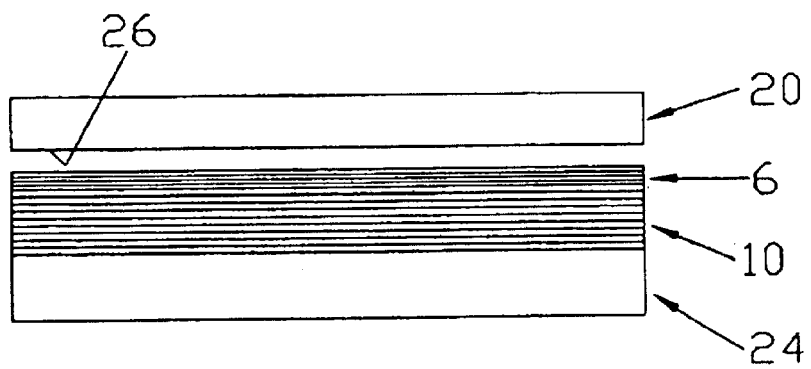

2. The structure of FIG. 2A is mounted to a host substrate of choice 24 (FIG. 2B). Next, the temporary substrate 20, upon which the MQW structure 6 resides, is selectively removed by an etch-back technique (FIG. 2B). In this method, a highly selective etchant is used to etch the temporary substrate 20, and etching is terminated at a strategically located etch-stop layer 26. It has been found that a one-to-one mixture of concentrated hydrochloric acid and hypochloric acid removes InP preferentially over InGaAs. In the case of a GaAs substrate, a citric acid and hydrogen peroxide mixture can be used for selective removal of the temporary substrate 20 over AlAs. Another approach, which has been found to be useful with GaAs substrates, is to grow a thin layer of AlAs between the temporary substrate 20 and the MQW structure 6 deposited thereon. The AlAs may then be selectively etched. This allows the MQW structure 6 to be lifted away from the GaAs substrate.

Figure 2C:
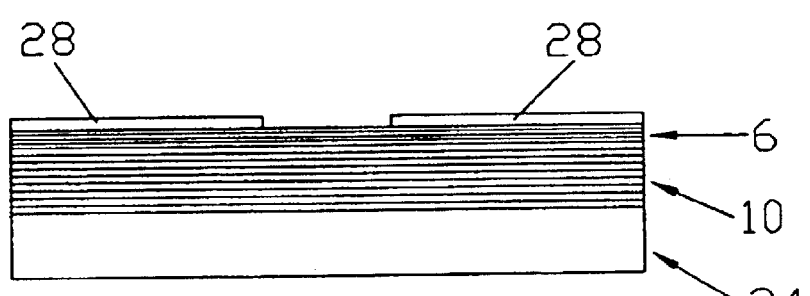

3. When fabricating a tunable VCSEL where suitable epitaxial DBR mirrors are available, such as GaAs (AlGaAs systems), DBR's 10 may be grown on top of substrate 24, and then MQW 6 may be grown, together with suitable cladding layers. At this stage, one of the tuning electrodes and VCSEL bias electrode, 28, is deposited on top of the MQW structure 6 (FIG. 2C). If appropriate, an insulating layer (i.e., an electrically insulating layer) may be deposited along some or all of the electrode 28. See, for example, FIGS. 3B and 3C where an insulator layer 29 is shown atop electrode 28.

Figure 2D:
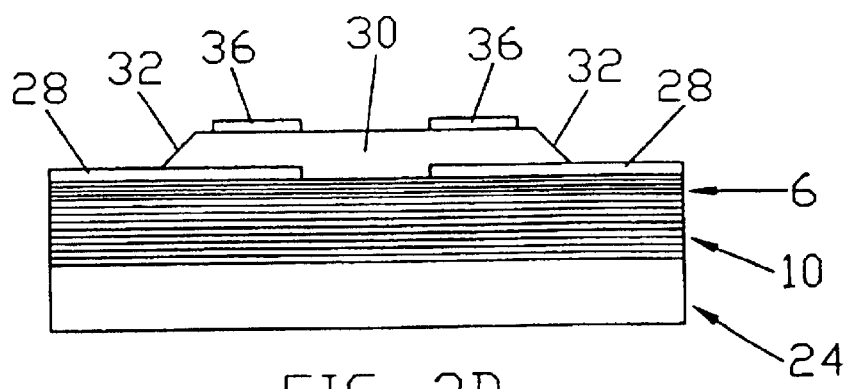

4. After MQW structure 6 and DBR layer 10 have been deposited on the substrate 24, a calibrated thickness 30 of polyimide, or aluminum, or some other sacrificial material, is deposited on top of the MQW structure 6 (FIG. 2D). The polyimide or aluminum structure 30 will act as a sacrificial layer later in the method as described in detail below. It should be appreciated that it is very important to accurately control the thickness and lateral dimensions of the polyimide or aluminum structure 30. This is because the thickness of this deposit will determine the ultimate length of the air cavity 8 (FIG. 1) in the tunable Fabry-Perot device and, hence, the unbiased resonant wavelength of the device. The lateral dimension of the polyimide or aluminum deposit 30, on the other hand, determines the voltage response of the device and the resonance frequency.

5. Thereafter, an etch-mask is used to pattern the polyimide or aluminum deposit 30 so as to leave a circular disk-shaped deposit defining an outwardly slanted edge 32 on its etched perimeter (FIG. 2D). The size and shape of the etched deposit 30 is carefully designed and controlled because its outer surface will determine the length of the top mirror support. Specifically, the disk of polyimide or aluminum acts like a "micro-die" which precisely controls the lateral dimensions and shape of the tunable VCSEL. This precise control of the lateral dimensions of the tunable VCSEL is unparalleled by any existing techniques employed in existing MEM tunable VCSEL fabrication. As alluded to above, later in the process, the polyimide or aluminum layer 30 will be selectively removed using a suitable dry-etching technique.

6. In the case wherein a $Si_3N_4$ membrane is used for top mirror support, a thin layer 36 (FIG. 2D) of metal is first deposited on the exposed top surface of the polyimide or aluminum deposit to form the top tuning electrode.

Figure 2E:
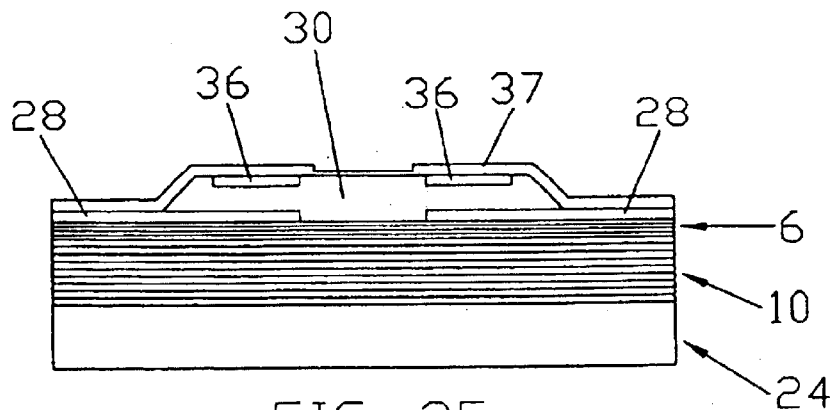

7. Thereafter, either a thin layer of silicon nitride or a thin layer of another metal other than aluminum, e.g., titanium-tungsten (TiW), generally shown at 37, is deposited over the entire structure, i.e., over the polyimide or aluminum sacrificial layer 30 and the remaining structure (FIG. 2E). In the case where layer 37 is not transparent, its center portion (FIG. 2E) is removed.

Figure 2F:
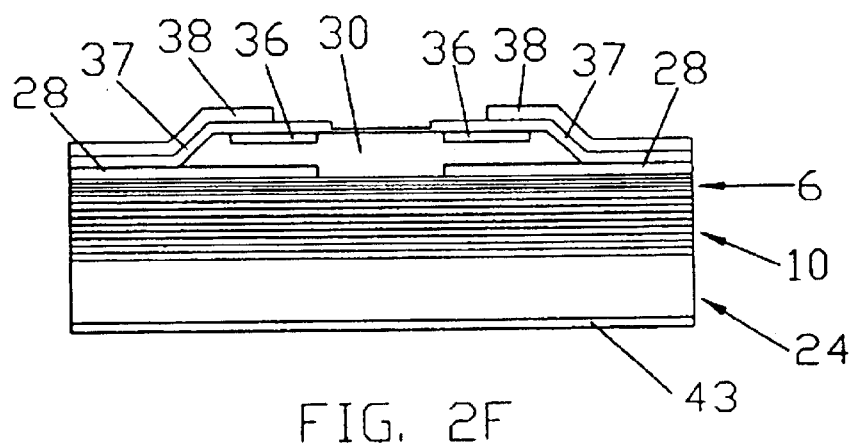

8. A thick layer 38 of metal (such as Al or TiW) or hard dielectrics (such as silicon nitride) forming a rim (in the case of a membrane type device, such as is shown in FIG. 3A) or patches of support-forming arms (in the case of a tether device, such as is shown in FIG. 3B or 3C) is then selectively deposited on the periphery of the device where the device membrane or tethers meet the bottom DBR. The width of annulus or support patches 38 is selected such that a thick metal rim extends from the top of the bottom DBR 10, over the sloped edge 32 of the sacrificial layer 30 of polyimide or aluminum, and onto the top of the sacrificial disk 30, as indicated in FIG. 2F. This is an important innovation because the thick metal structure 38 provides robust support to the thin membrane 37 of silicon nitride or TiW after the underlying sacrificial layer 30 of polyimide or aluminum has been removed.

9. Using an etch-mask, radially emanating openings 40 (FIG. 3A) then are formed by etching through the transparent metal and silicon nitride or the thin (TiW) film, 37, down to the underlying sacrificial disk 30. These openings provide gateways for the etchants to selectively remove the underlying sacrificial disk 30.

10. A circular top DBR stack 12, extending tens of micrometers in diameter, is then selectively deposited only at the center 42 (FIGS. 2G and 3A–3C) of the silicon nitride/metal membrane or TiW film 37. This selective deposition provides an extremely good quality DBR, and avoids having to etch the top DBR, which can be a difficult and costly effort. To the extent that top DBR stack 12 is to assume a curved configuration in the completed device (e.g., as shown in FIG. 1), an appropriate magnitude and type of strain is introduced into top DBR stack 12 during deposition of the top DBR stack, in the manner discussed above.

11. At this stage, the bottom bias electrode 43 should be deposited.

Figure 2G:
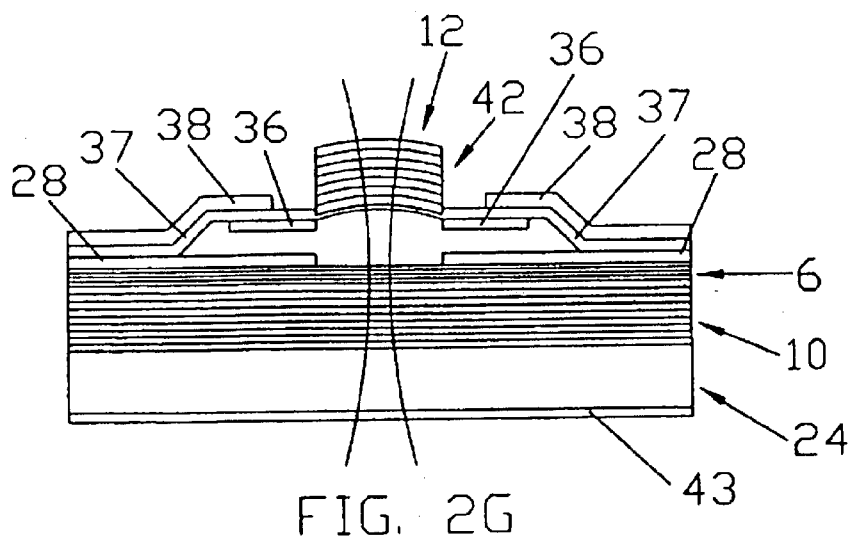

12. Finally, an oxygen plasma is used to selectively remove the polyimide layer 30 (FIG. 2G). This releases the silicon nitride/metal membrane 37 along with the top DBR 12. To the extent that top DBR stack 12 is formed with an appropriate magnitude and type of strain to result in the formation of a curved DBR stack, the release of silicon nitride/metal membrane 37 permits the top DBR stack 12 to assume its desired curved configuration. $CF_4$ plasma is used in the case of selective removal of an aluminum sacrificial layer 30. Since wet chemistry is not involved, there is no risk of the released silicon nitride/metal membrane or TiW film, 37, collapsing due to surface tension.

This completes the fabrication of a MEM tunable VCSEL in which lasing is accomplished by current injection.

Further Modifications To Enhance Uniform Current Injection

Figure 4:
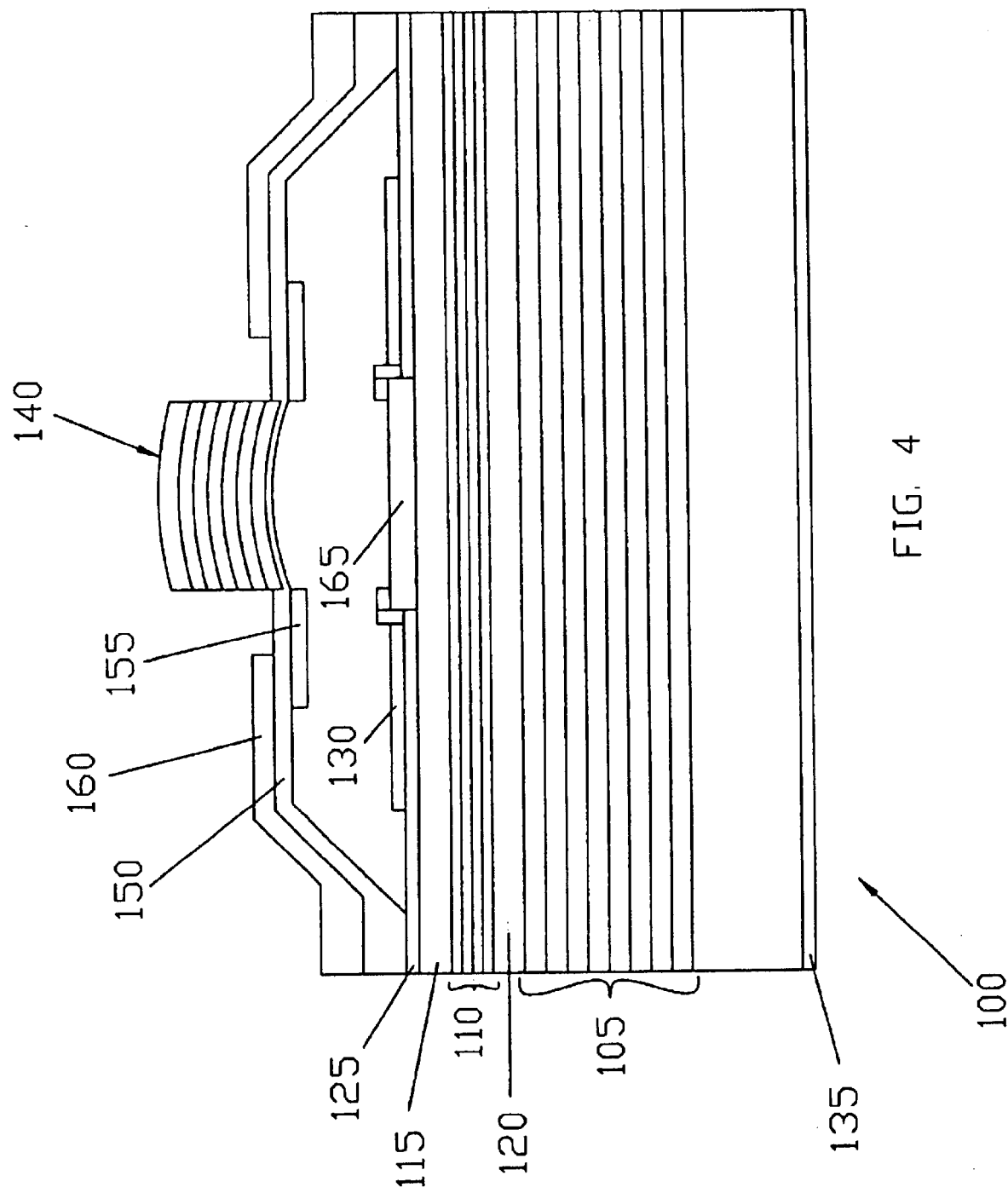
FIG. 4 is a side elevational view, in cross-section, schematically and diagrammatically illustrating a half-symmetric tunable VCSEL adapted to provide uniform current injection.

Referring next to FIG. 4, there is shown a current-injected MEM-tunable VCSEL 100. Where VCSEL 100 is adapted to operate in the 600–1000 nm range, GaAs-based technology can be used, and the bottom DBR mirror 105, consisting of $GaAs/Al_xGa_{1-x}$, may be grown epitaxially. GaAs and AlAs layers have a refractive index difference of 0.5. Mirrors consisting of 30 pairs of alternating GaAs and AlAs layers can have a reflectivity of greater than 99.8%. However, the invention may also be implemented with material systems where suitable mirrors cannot be grown epitaxially. For example, the bottom mirror 105 may be attached to the active gain medium 110 by, for example, wafer bonding or deposition of dielectric mirrors, etc. The bottom mirror 105 should be chosen such that it will not absorb the light from active region 110.

The active region 110 typically consists of three or four Ga(In)As quantum wells, separated by the Ga(Al)As barriers. The quantum well active region 110 is positioned so as to contain the maximum of the standing wave so as to improve VCSEL performance.

The active region 110 is typically sandwiched between cladding layers 115 and 120. One of the cladding layer 115 (in this case the upper cladding layer) includes specific structures or doping mechanisms so as to ensure uniform lateral current injection, as described below. To ensure efficient tuning, the thickness of the upper cladding layer 115 should be around 300–400 nm thick.

The top p-contact Ga(Al)As layer 165 is heavily p-doped to $10^{19}$ or $10^{20}$ $cm^{-3}$, with a typical thickness of 50 nm. The structure is designed such that the standing wave is null at the top surface of p-contact layer 125, minimizing free-carrier absorption.

Before fabricating the movable membranes, a top p-contact metal 130, such as a Ti/Pt ring contact, and a AuGeNiAu bottom n-contact layer 135, are then applied through RF or DC sputtering. One skilled in the art also may use other technologies to deposit such metal contacts.

Following these steps, a movable DBR structure 140 is fabricated on the top of the device. This is done in the manner described above, i.e., using a patterned sacrificial polyimide layer which defines the lateral and air gap size of the device. A 200 nm thick PECVD silicon nitride layer and a 100 nm thick aluminum layer are then deposited and etched so as to define the device tethers 150, top electrode 155, and openings for removal of the polyimide. Where the device tethers 150 meet the periphery of the polyamide, a 2000 nm thick layer 160 of aluminum or $PECVD-SiN_x$, sometimes referred to as a post, is deposited so as to provide support to the structure following removal of the polyimide. Finally, the top mirror 140, consisting of seven and half pairs of quarter-wave stack $SiO_2/TiO_2$, are deposited by selective deposition at the center of the device. Other dielectric materials with high index contrast also may be used.

To release the device, the sacrificial polyimide is etched away using oxygen plasma, leaving no polyimide behind in the structure. In this embodiment of the tunable laser, the air gap may be viewed as part of the top mirror 140 (coupled cavity), therefore tuning efficiency is limited. An anti-reflection coating (not shown) may also be deposited on top of the contact layer 130 if desired. In this case, the air gap becomes part of the cavity, and tuning efficiency is therefore greatly improved.

The present invention addresses lateral current confinement and current injection so as to achieve continuous, single-mode operation throughout the tuning range of a VCSEL. In conventional fixed-wavelength VCSEL's, single-mode lasing is achieved by reducing the aperture to roughly 3 or 4 $\mu$m. In the present tunable VCSEL, a curved mirror defines and shapes the beam, and the minimum aperture size should be greater than 16 $\mu$m for sustained lasing operation. This relatively large aperture, as compared to that of conventional flat-mirror and fixed-wavelength VCSEL's, requires extremely uniform current injection for sufficient gain in the center of the aperture for sustained single-mode lasing.

Several different mechanisms are provided for ensuring uniform current injection.

Figure 5:
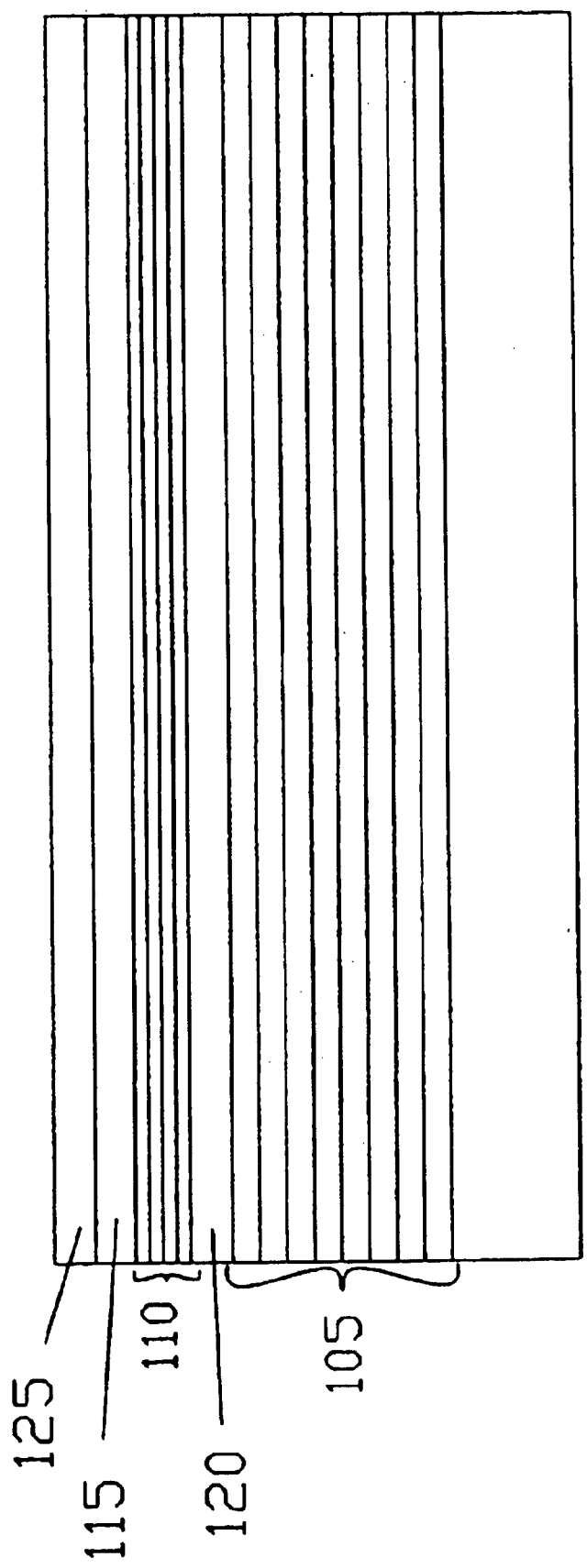
FIG. 5 is a side elevational view, in cross-section, of a portion of a VCSEL, showing how uniform current injection can be achieved using high doping and low doping regions.

One of the mechanisms for achieving such uniform current injection is the use of a p-contact layer 125 heavily doped with p-doping in the range of $10^{19}$ and $10^{20}$ $cm^{-3}$. See FIG. 5. The typical thickness of the p-contact layer 125 is preferably about 50 nm. At the same time, doping of the upper cladding layer 115 should be at least three orders of magnitude lower than the p-contact layer 125, in order to induce sufficient current spreading for uniform injection. The optimal thickness of top cladding layer 115 is roughly 300 nm so as to ensure efficient tuning.

Figure 6:
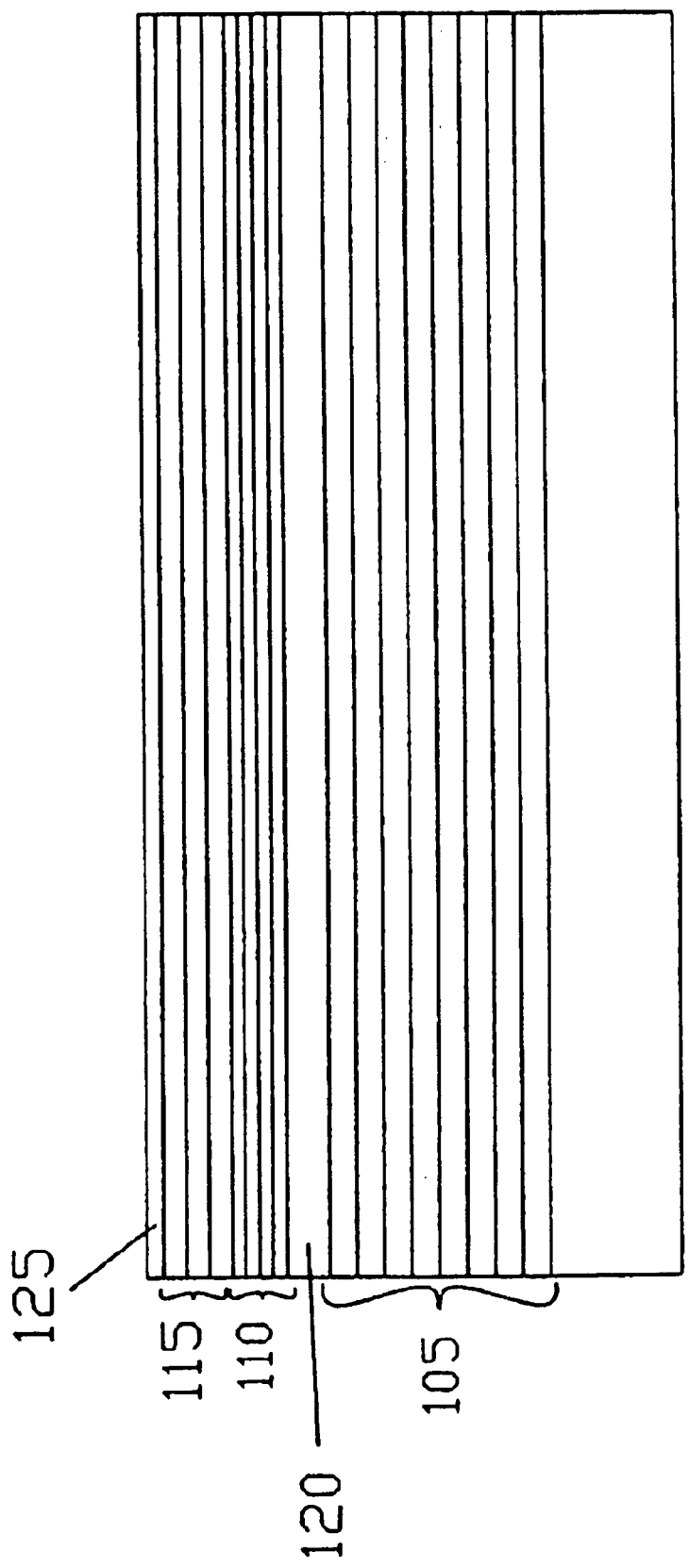
FIG. 6 is a side elevational view, in cross-section, of a portion of a VCSEL, showing how uniform current injection can be achieved using heterointerfaces.

Looking next at FIG. 6, a more efficient way to achieve uniform current injection is to include several heterostructures in the upper cladding layer 115. Heterointerfaces act as a barrier for the vertical current paths, thus increasing lateral carrier spreading. For example, in the 600–1000 nm wavelength range, where GaAs epitaxial technology can be employed, three pairs of $Al_{0.1}Ga_{0.9}As/Al_{0.5}Ga_{0.5}As$ heterointerfaces are included. The thickness of each individual layer is chosen so as to be ($\lambda/8n$,) so that distortion of the standing wave of the whole microcavity is minimized. The total thickness of upper cladding layer 115, when incorporating such heterostructures, is preferably about 300 nm.

Figure 7:
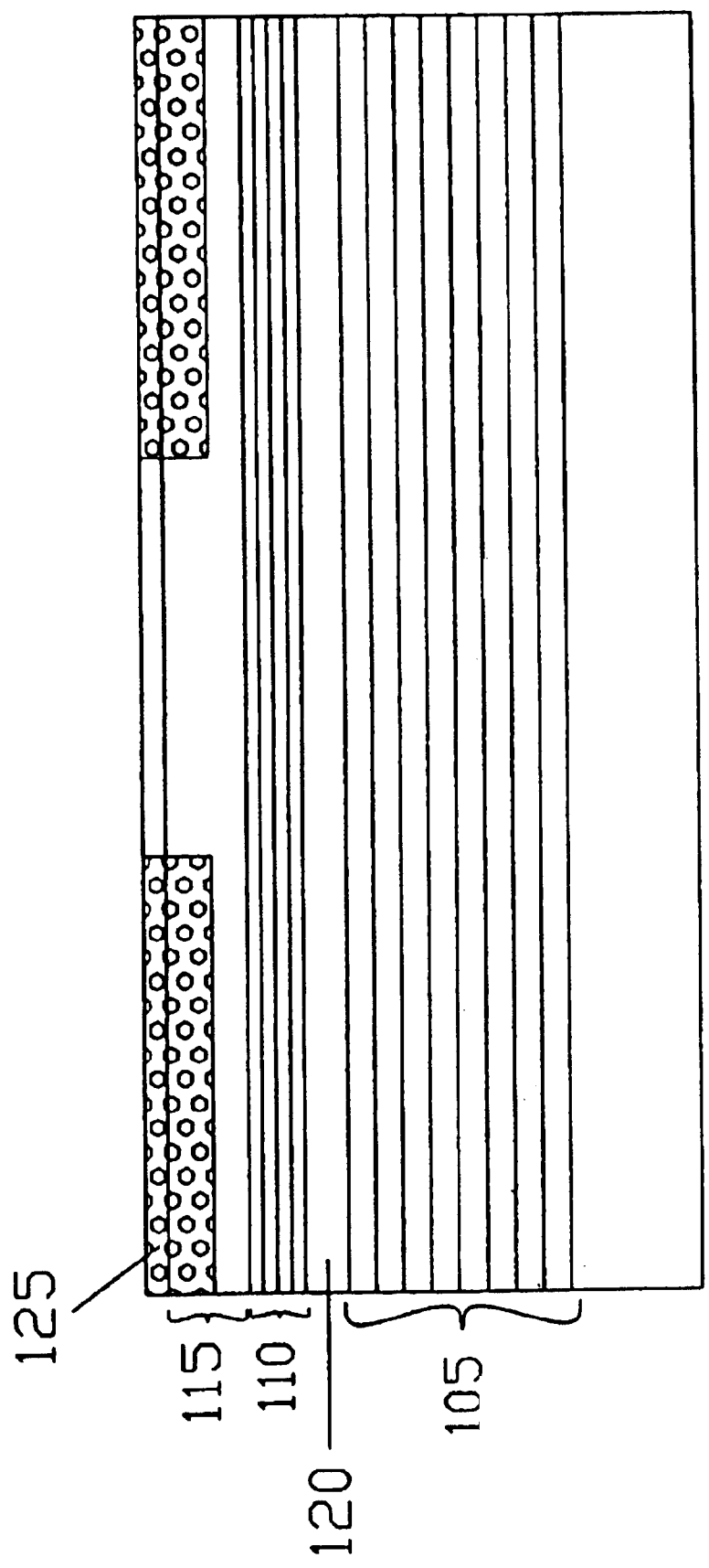
FIG. 7 is a side elevational view, in cross-section, of a portion of a VCSEL, showing how current confinement can be achieved through ion-implantation.

As described above, to ensure single-mode operation, lateral current confinement is also necessary. FIG. 7 shows an embodiment of a VCSEL constructed with an ion-implantation method so as to achieve lateral current confinement. For example, O+ ions may be implanted in p-contact layer 125 and upper cladding layer 115 with an energy of 80–100 KeV at a dose of approximately $10^{14}$ $cm^{-3}$. Under this condition, the implantation does not damage the quantum well active region 110. Alternatively, H+ implantation may also be used to achieve isolation, with the H+ ions being implanted with an implant energy of 30–40

KeV at doses of approximately $10^{14}$ cm$^{-3}$. The implant energy and dosage are chosen such that the top p-contact layer 125 is electrically conductive. The metal ohmic contact 130 (not shown in FIG. 7 but shown in FIG. 4) may then be recessed from the aperture so as to achieve VCSEL's with high quantum efficiency.

Figure 8:
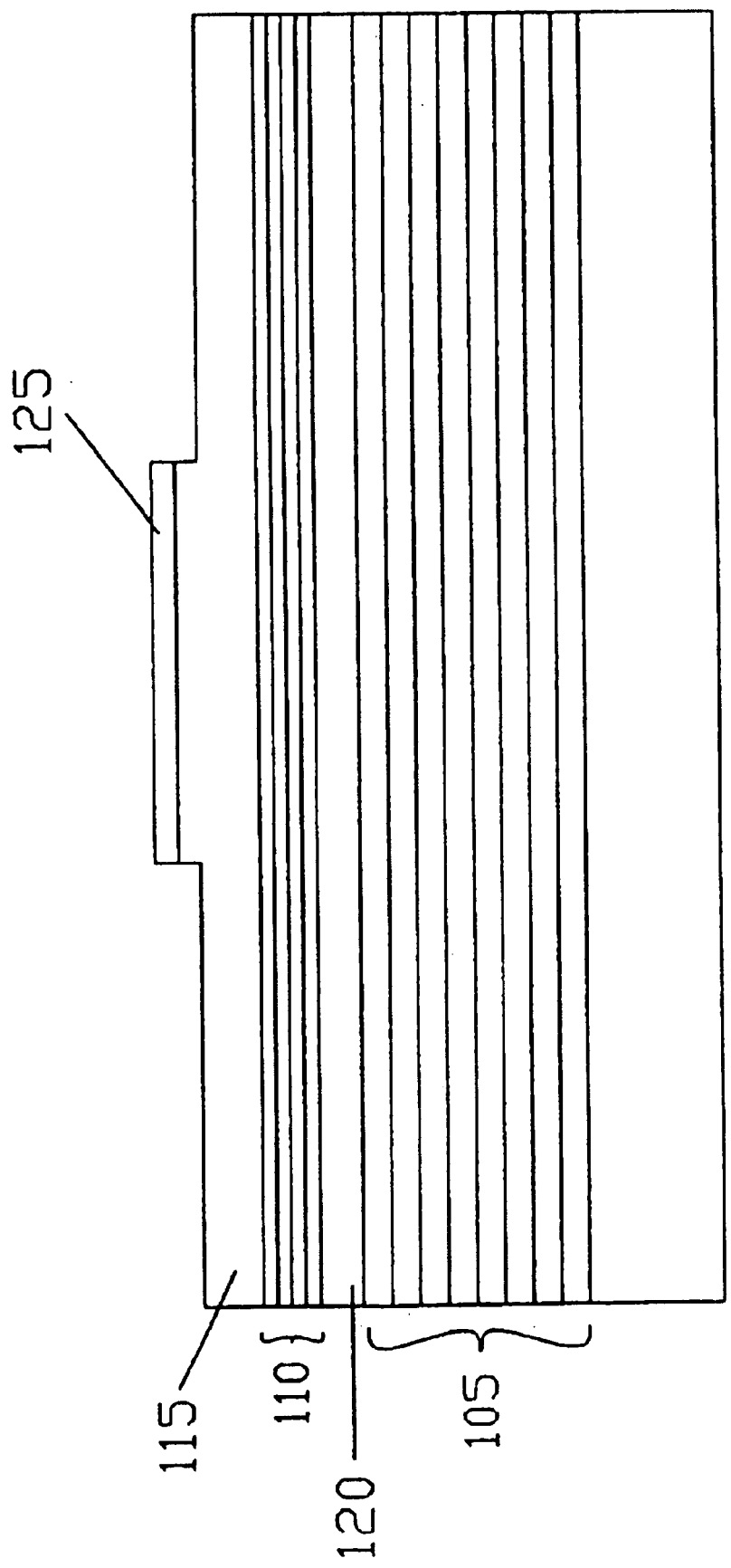
FIG. 8 is a side elevational view, in cross-section, of a portion of a VCSEL, showing how current confinement can be achieved through etching.

Looking next at FIG. 8, there is shown another mechanism to achieve current confinement. This mechanism involves etching away the top p-contact layer 125 outside the aperture region. This causes the current to be confined to the desired regions of the device.

Figure 9:
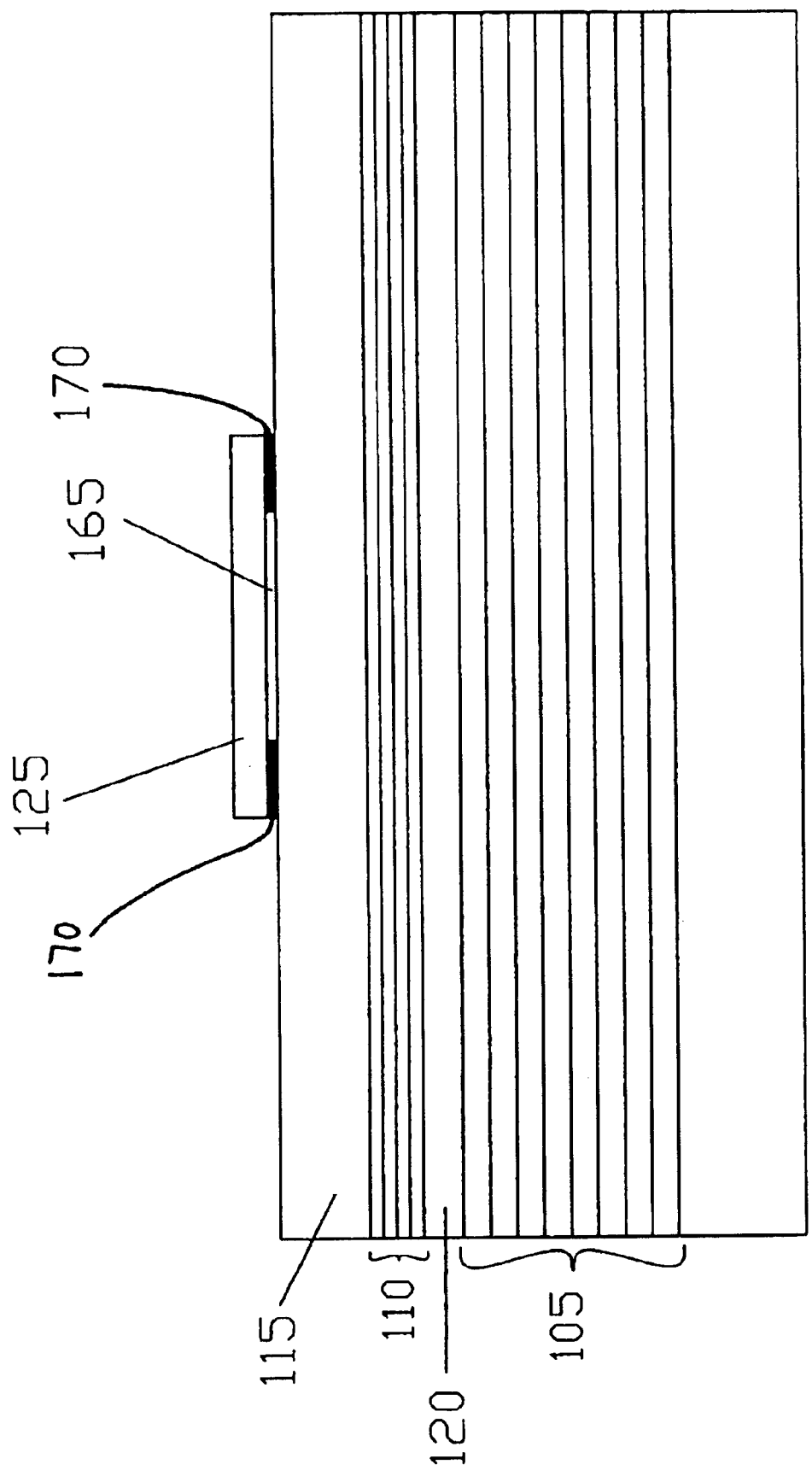
FIG. 9 is a side elevational view, in cross-section, of a portion of a VCSEL, showing how current confinement can be achieved through a dielectric aperture, such as an $AlO_x$ current-blocking layer, obtained through wet oxidation of Al-content semiconductor layers.

FIG. 9 shows another way to achieve current confinement. This construction uses an oxidized, thin, high Al-content layer 165. Layer 165 may be grown epitaxially as part of the VCSEL structure. In a GaAs system and for 0.8–1 $\mu$m VCSEL's, such layer 165 may be AlAs or Al$_x$Ga$_{1-x}$As (x>90%). After etching to expose the AlAs layer, the layer may be oxidized by passing water steams with an N$_2$ gas carrier in an ambient temperature of 350–450 degrees C. The oxidation rate is controlled by the ambient temperature, the flow rate and the Al concentration in the layer.

After oxidation, the AlAs is transformed into insulating AlO$_x$ with a refractive index of roughly 1.65. The AlO$_x$ layer 170 blocks current. To reduce scattering loss and VCSEL mode modification, the AlAs layer 170 should be thin, on the order of less than 30 nm, and ideally should be placed at the node of the cavity standing waves.

For 1.3–1.55 $\mu$m VCSEL's, current blocking layers can be achieved by oxidation of InAlAs or other Al-based materials. For example, InAlAs layers can also be grown epitaxially on InP-based material systems.

Figure 10:
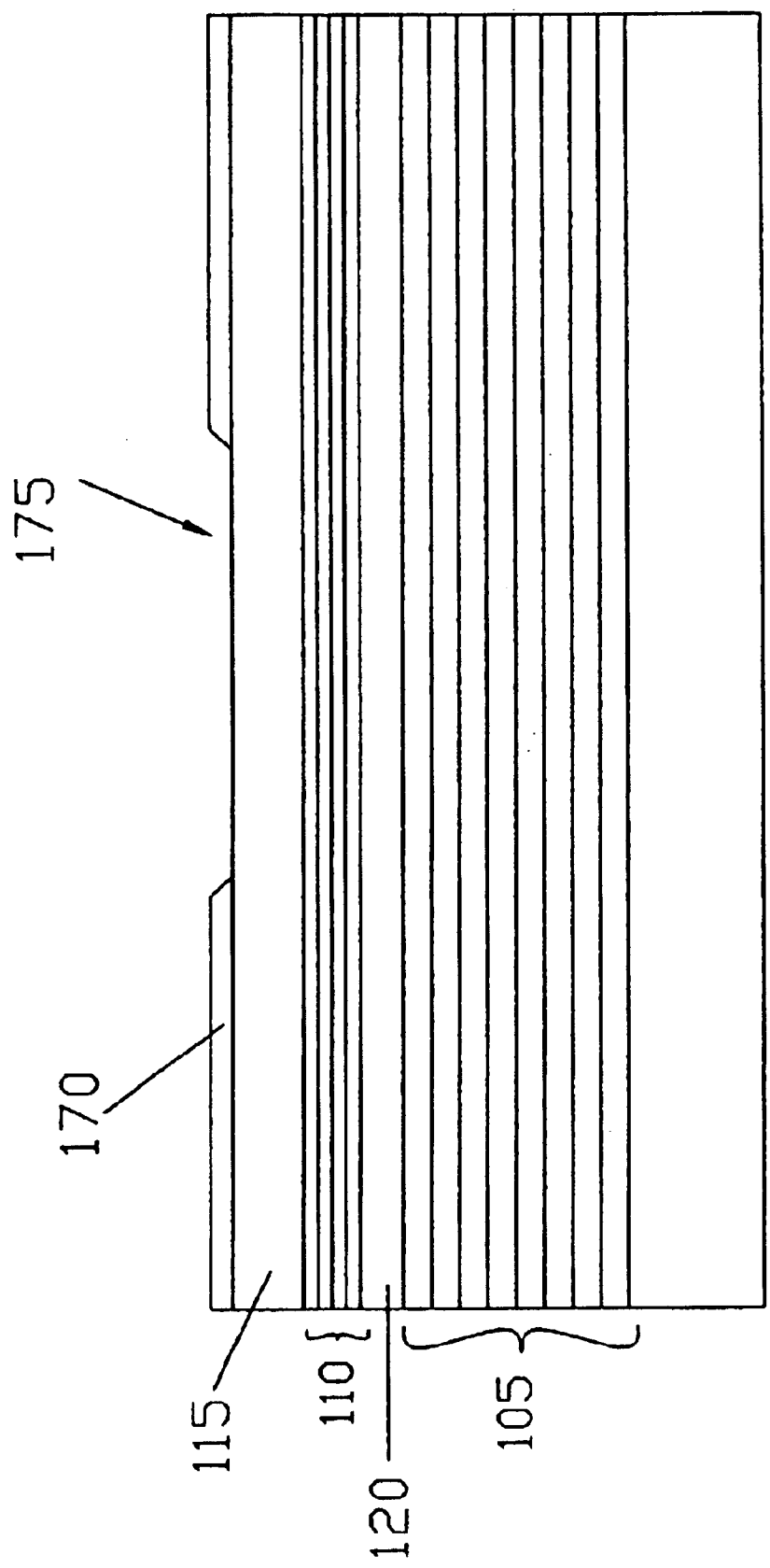
FIGS. 10 and 11 are side elevational views, in cross-section, of a portion of a VCSEL, showing how current confinement can be achieved by forming an n-doping layer on top of the active region and the upper cladding layer, the n-doping layer having an aperture therein, and then forming a p-contact layer on top of the n-doping layer by regrowth technique.
Figure 11:
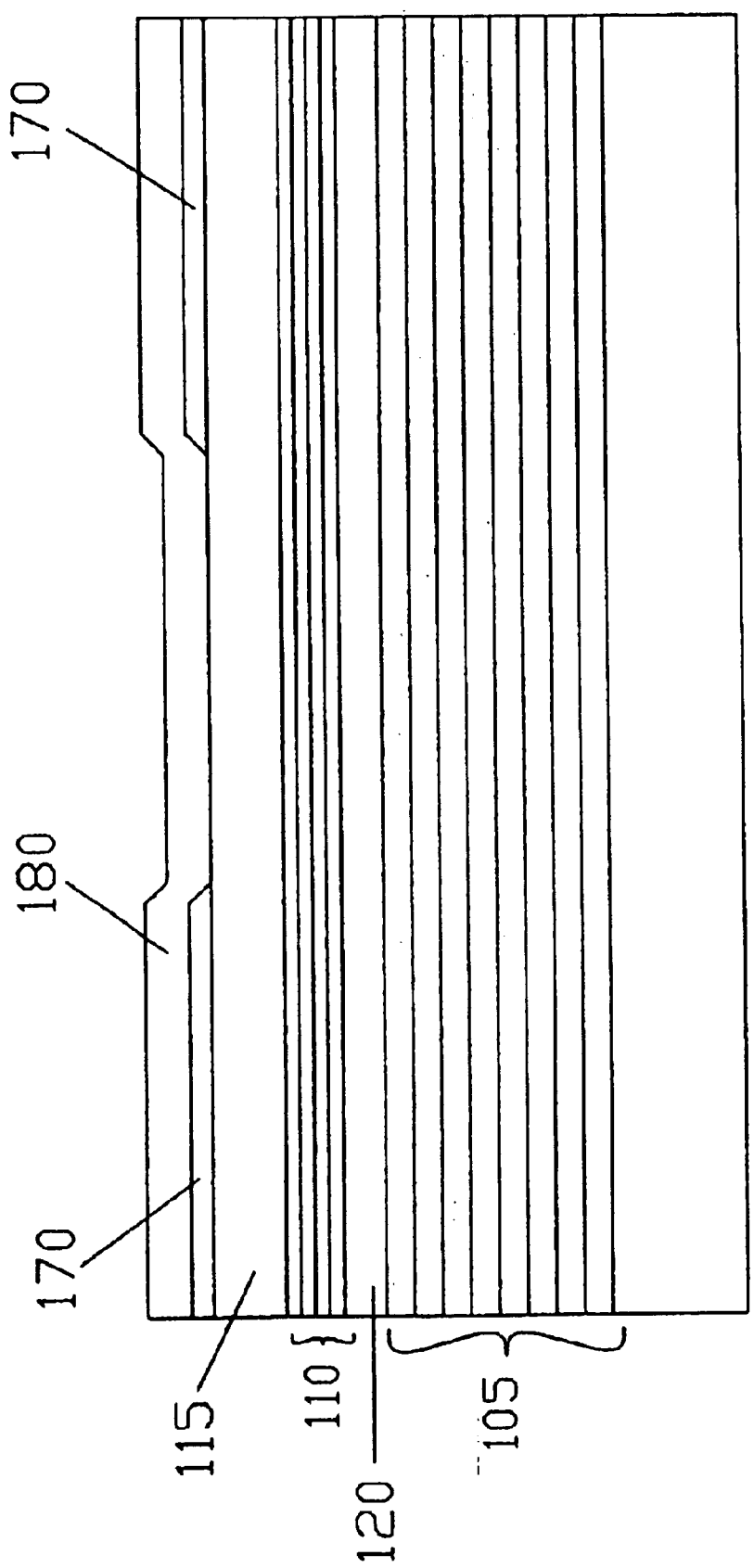

Epitaxial re-growth incorporating reversed-biased p-n layers also confines current. FIG. 10 shows a VCSEL with a top n-doping layer 170, but with the layer 170 removed in the aperture region 175. Subsequently, a highly-doped p-contact layer 180 (FIG. 11) is grown epitaxially by MBE or MOCVD. Outside the aperture region 175, the p-n-p layer (i.e., p-doped top cladding layer 115, n-doped layer 170 and p-doped layer 180) blocks current when the laser diode is under forward bias. To ensure uniform current injection, heterostructures such as those described above may also be incorporated into the device. Current confinement is contingent upon proper doping and the thickness of the n-doping layer 170 and the top p-contact layer 180.

Figure 12:
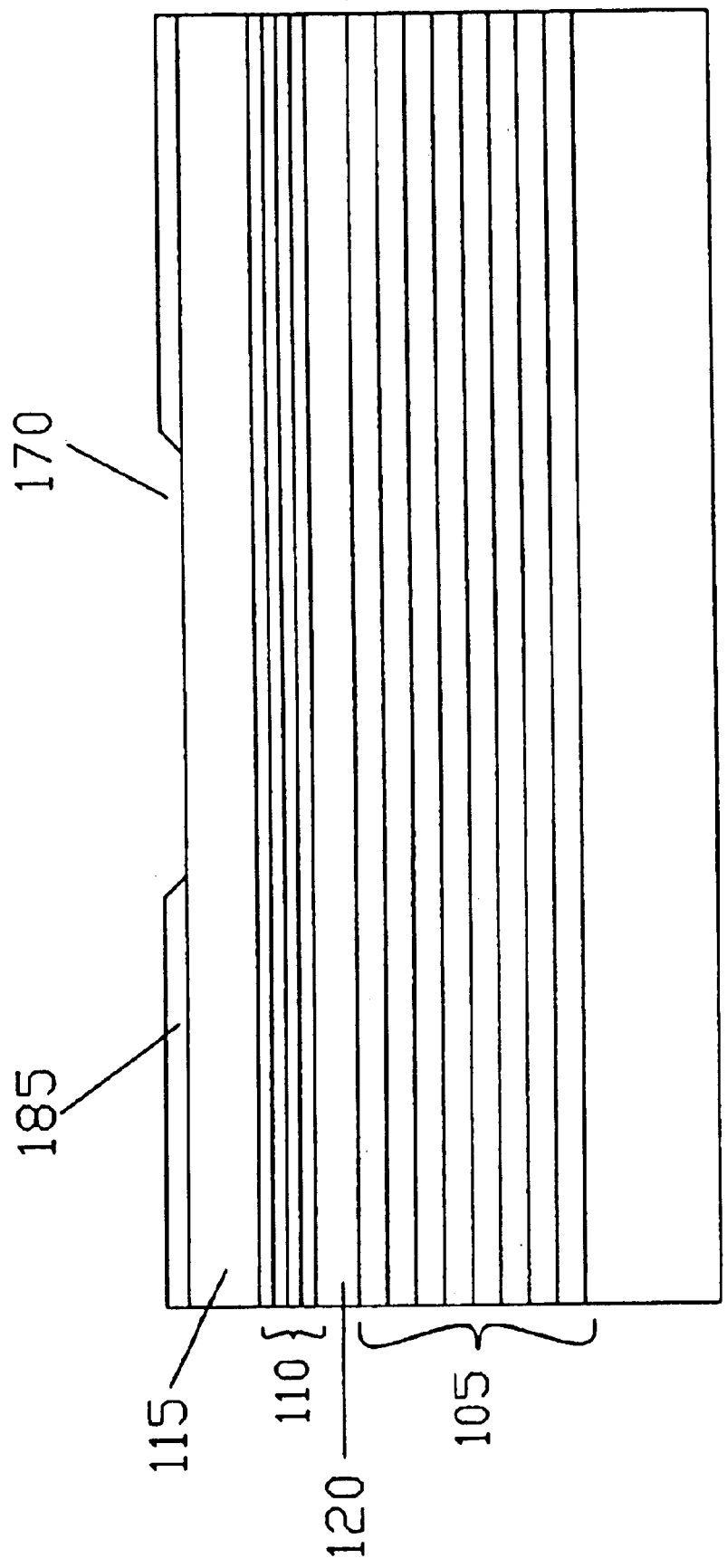
FIGS. 12 and 13 are side elevational views, in cross-section, of a portion of a VCSEL showing how current confinement can be achieved by growing a high-resistive layer, such as low-temperature growth GaAs, on top of the active region and upper cladding layer, the high-resistive layer having an aperture therein, and then forming a p-contact layer on top of the high-resistive layer by regrowth technique.
Figure 13:
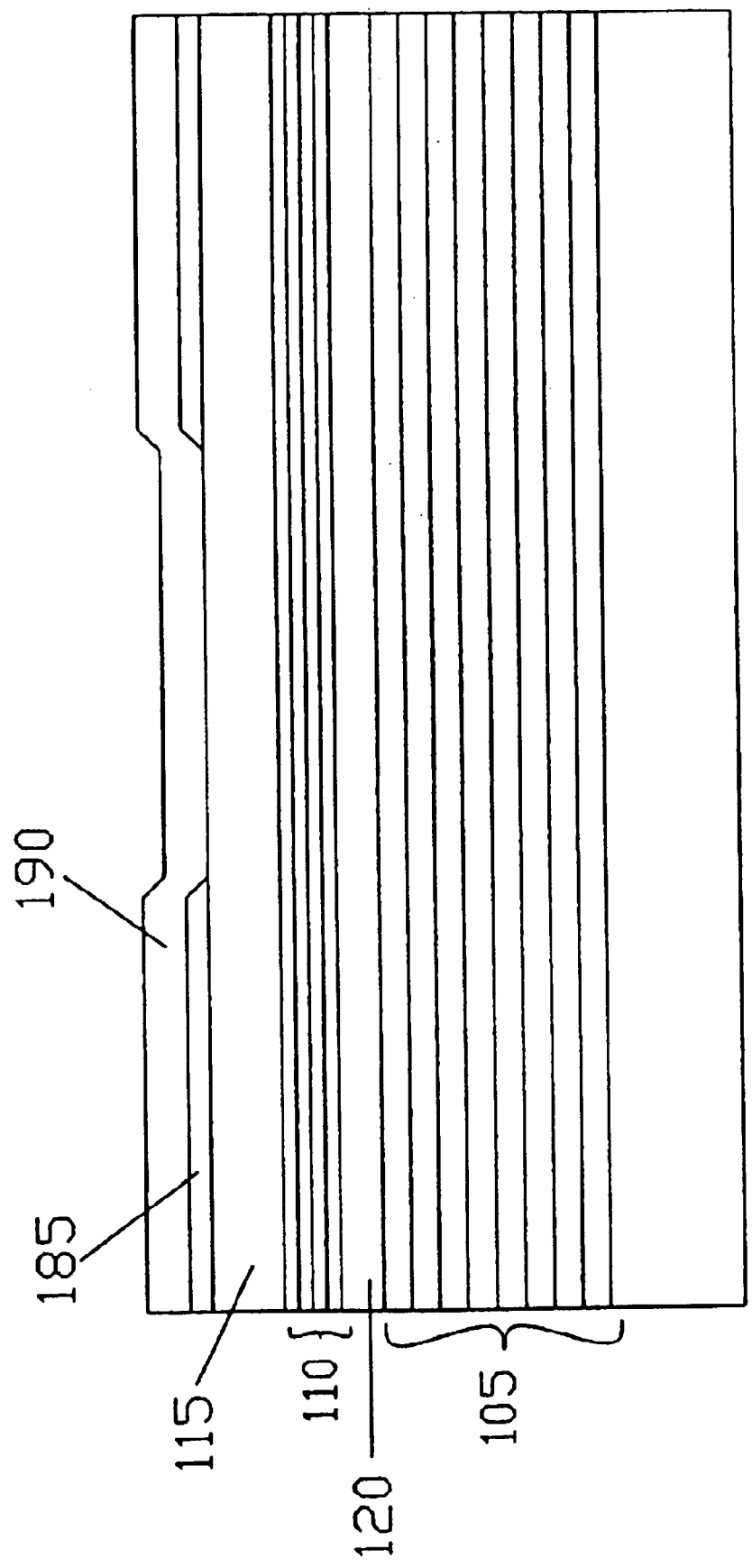

Referring next to FIG. 12, another embodiment of a VCSEL utilizes epitaxial re-growth for current confinement. In the initial wafer growth, a thin layer 185 of 10 nm GaAlAs is grown at 250–300 degrees C. under high As-pressure. Upon high temperature (650 degrees C.) annealing, the low temperature GaAlAs becomes highly resistive and acts as a current blocking layer. After etching to define an aperture region 175, a highly-doped p-contact layer 190, greater than $10^{19}$ cm$^{-3}$, is grown epitaxially by MBE or MOCVD (FIG. 13). Low-doping layers and heterointerfaces also may be incorporated.

Figure 14A:
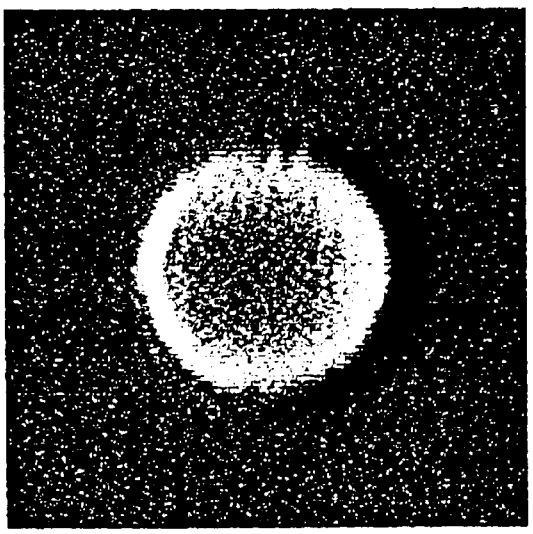
FIGS. 14A–14C show the performance characteristics of a VCSEL lacking the aforementioned current confinement mechanisms.
Figure 14B:
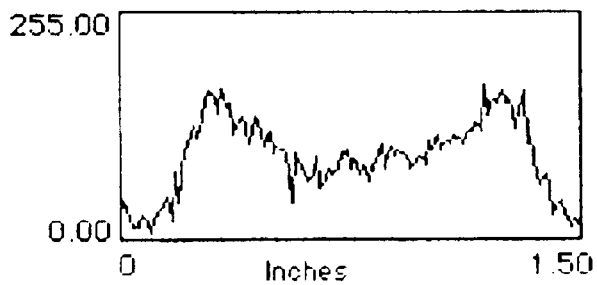
Figure 14C:
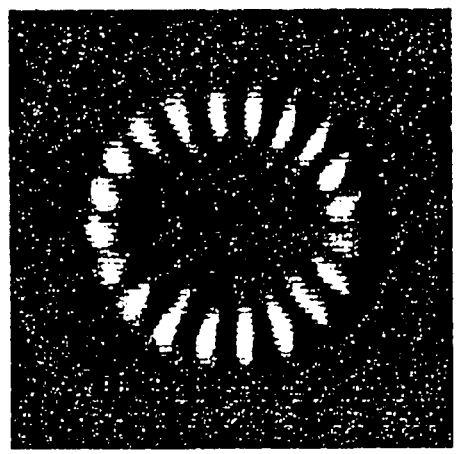

FIGS. 14A–14C show representative performance characteristics for a tunable VCSEL lacking the current injection mechanisms described above, and FIGS. 15A and 15B show representative performance characteristics for a VCSEL incorporating a current injection mechanism of the type described above.

Figure 16:
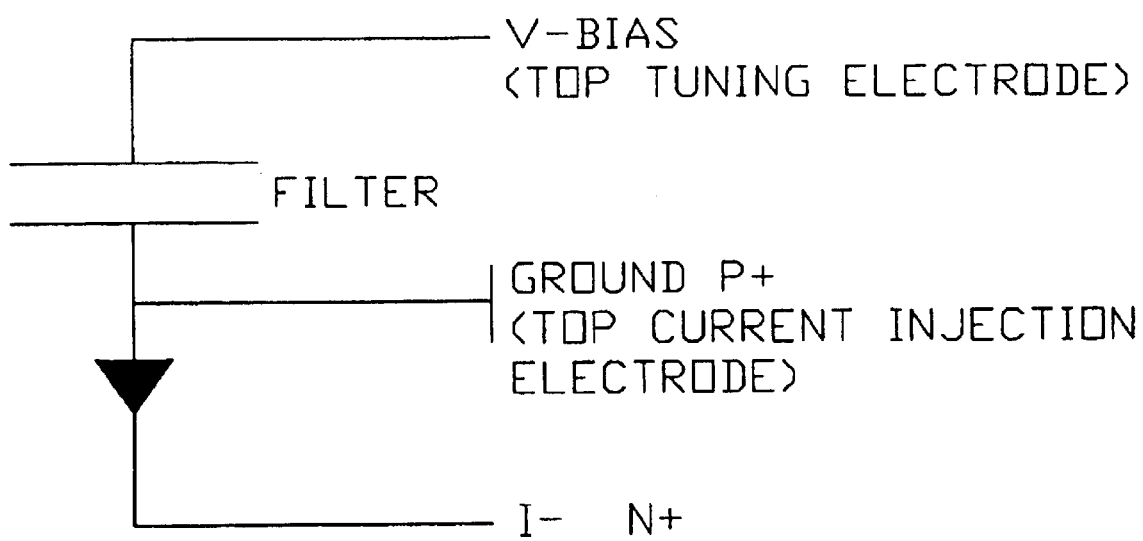
FIG. 16 is a schematic diagram of an electrical circuit which may constitute a bias mechanism for a tunable VCSEL.

FIG. 16 shows an equivalent electrical circuit for an independent tuning and bias mechanism. To achieve this, the top p-contact layer is grounded.

Figure 17:
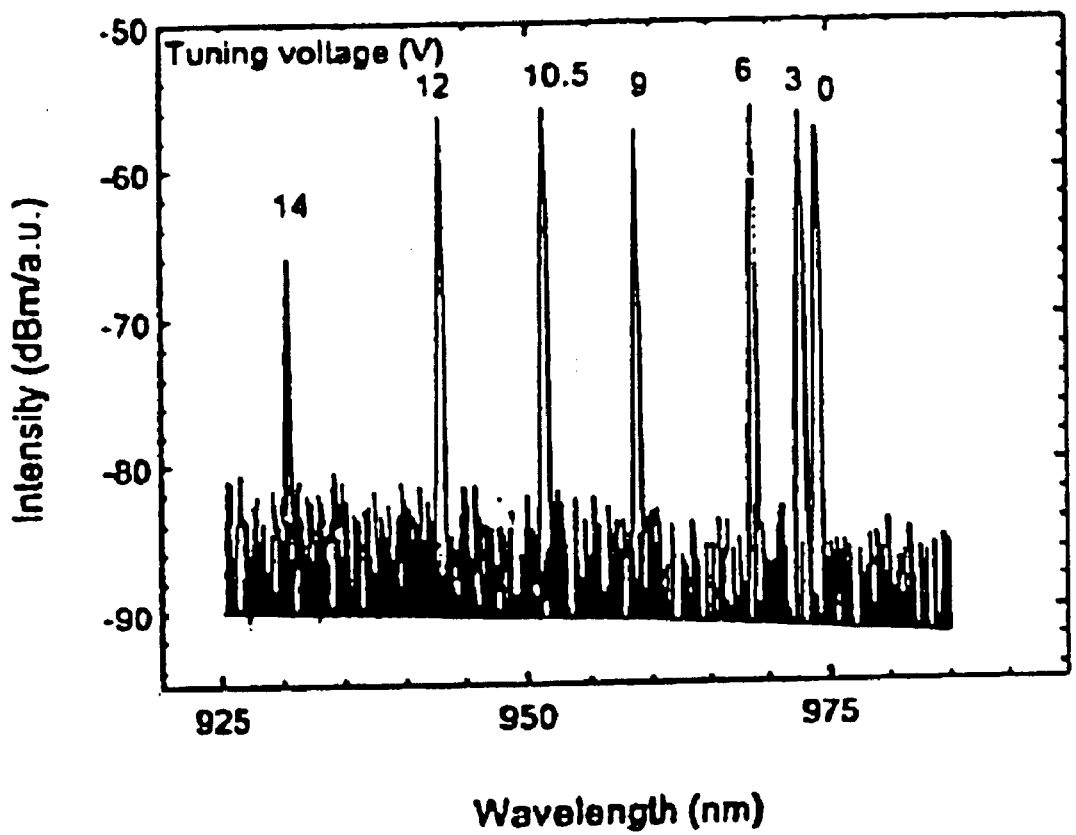
FIG. 17 is a graphical representation of the tuning characteristics of a tunable VCSEL formed in accordance with the present invention.

FIG. 17 graphically demonstrates the tuning characteristics of a tunable VCSEL tuned with the foregoing tuning mechanism. The half-symmetric structure of the tunable version, shown in FIGS. 15A and 15B, operates in a single fundamental spatial and transverse mode TEM$_{oo}$, as desired. The measured spot size, roughly 6 $\mu$m of the cavity, matches well with an effective cavity length of roughly 3 $\mu$m and the measured curvature of roughly 300 $\mu$m of the top mirror. The typical threshold current for the tunable structure is 4.5 mA. Maximum output power is 0.9 mW, with the laser operating at 10 mA.

Figure 15A:
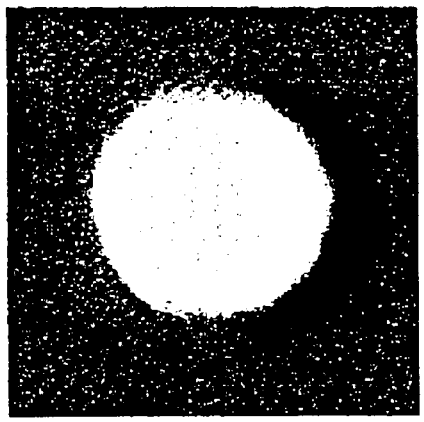
FIGS. 15A–15C show the performance characteristics of a VCSEL incorporating the aforementioned current confinement mechanisms.
Figure 15B:
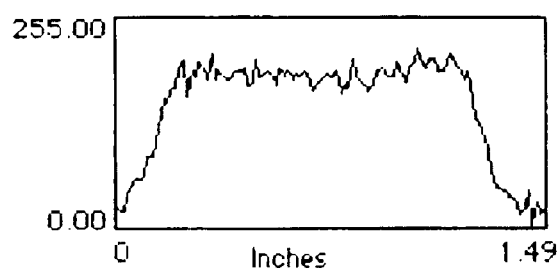
Figure 15C:
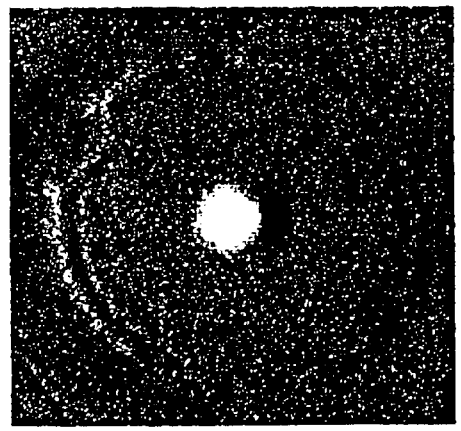

Continuous tuning of the laser is achieved by applying an electrostatic voltage to the top electrode 155 (FIG. 4). As shown in FIG. 17, the lasing spectrum range of the device, at various tuning voltages, is approximately 44 nm, with a voltage swing of 14 V operating near 950 nm. The use of a dielectric top mirror allows for a wider tuning range, as compared to devices in which both top and bottom DBR's are semiconductor-based. The laser also achieves single-mode operation with side mode suppression of at least 20 dB, as shown in FIGS. 15A and 15B.

Further Modifications

Figure 18:
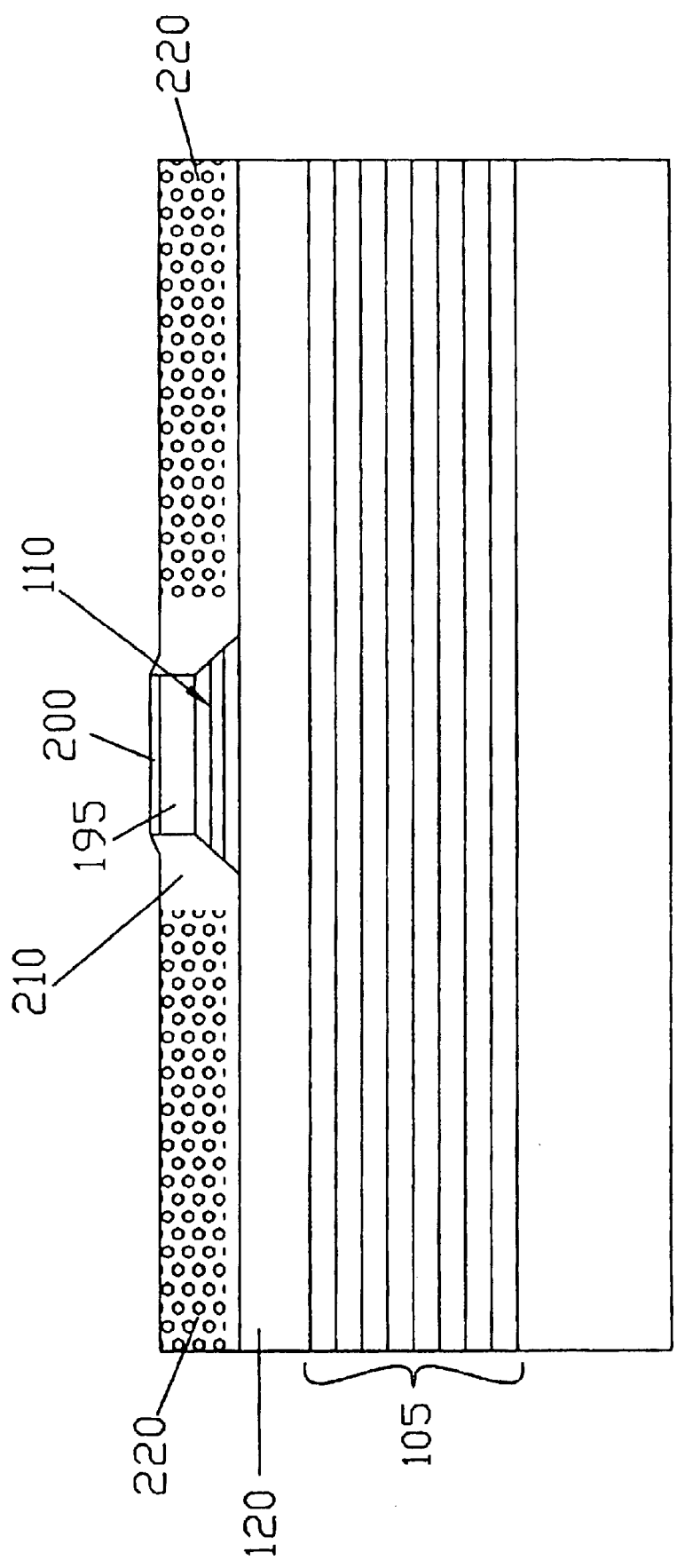
FIG. 18 is a side elevational view of a portion of still another VCSEL formed in accordance with the present invention.

It will be understood that the foregoing detailed description of preferred embodiments of the invention has been presented by way of illustration, and not limitation. Various modifications, variations, changes, adaptations and the like will occur to those skilled in the art in view of the foregoing specification. For example, a combination of the above mentioned techniques can be employed so as to ensure uniform current injection in the center aperture. FIG. 18 shows one such embodiment in which etching, regrowth and ion-implantation were employed simultaneously. In the first step, the active region is defined by etching so that only the center of the aperture has gain medium (110), top cladding layer 195 and top contact layer 200. By doing this, uniform current injection is maintained throughout the operation conditions described above. Secondly, the top cladding layer (210) is regrown by MOCVD or BME around the active region. Finally, ion-implantation (or a GaAs LTG layer or an AlAs oxide layer) 220 is incorporated so as to ensure further current confinement. Accordingly, the present invention should be understood as being limited only by the terms of the claims.

What is claimed is:

1. A microelectromechanically tunable vertical cavity surface emitting laser, said laser comprising:

(a) a first electrode having a top surface;

(b) a substrate having a top surface, said substrate being attached to said top surface of said electrode;

(c) a first mirror having a top surface, said first mirror being attached to said top surface of said substrate;

(d) a first layer of cladding having a top surface, said first layer of cladding being attached to said top surface of said first mirror;

(e) a layer of gain material having a top surface and defining multiple quantum wells, said layer of gain material being attached to said top surface of said first layer of cladding;

(f) a second layer of cladding having a top surface, said second layer of cladding being attached to said top surface of said layer of gain material;

(g) current confinement means in the form of an isolation layer attached to said top surface of said second layer of cladding;

(h) a contact layer, in the center of isolation layer, having a top surface, said contact layer being attached to said top surface of said second layer of cladding;

(i) a second electrode, said second electrode being attached to said top surface of said contact layer;

(j) a support structure having an upper surface and a lower surface, said support structure, comprising a peripheral portion that is fixed with respect to said second layer of cladding and said contact layer and a center portion that is spaced from said contact layer, said peripheral portion being able to flex to allow translational movement of said center portion relative to said contact layer, and said support structure defining the length and lateral dimensions of an air cavity located between said lower surface of said support structure and said upper surface of said contact layer;

(k) a third electrode, said third electrode being attached to said support structure; and (l) a second mirror attached to said support structure such that said second mirror is translatable relative to said first mirror in response to an electric field applied between said second and third electrodes.

2. A laser according to claim 1 further comprising uniform current injection means, wherein said uniform current injection means comprising p-doping said contact layer in the range of $10^{19}$ to $10^{20}$ cm$^{-3}$, and wherein said second cladding layer is doped three orders of magnitude less than the amount that said contact layer is doped.

3. A laser according to claim 1 further comprising uniform current injection means, wherein said uniform current injection means comprising a plurality of heterostructures formed in said second layer of cladding.

4. A laser according to claim 3 wherein said plurality of heterostructures provide at least one $Al_{0.1}Ga_{0.9}As/A_{0.5}Ga_{0.5}As$ heterointerface.

5. A laser according to claim 3 wherein each of said plurality of heterostructures has a thickness determined by $\lambda/8n$.

6. A laser according to claim 3 wherein the total thickness of said plurality of heterostructures is 300 nm to ensure sufficient tuning.

7. A laser according to claim 1 wherein said current confinement means comprise implanting said contact layer and said second layer of cladding with ions.

8. A laser according to claim 7 wherein said ions comprise O+ ions.

9. A laser according to claim 7 wherein said ions comprise H+ ions.

10. A laser according to claim 2 wherein said current confinement means are provided by etching said contact layer.

11. A laser according to claim 10 wherein said contact layer is etched so that it substantially conforms to the shape of said second mirror.

12. A laser according to claim 1 wherein said current confinement means comprise a layer of $AlO_x$ disposed between said contact layer and said second layer of cladding.

13. A laser according to claim 1 wherein said current confinement means comprise p-doping said contact layer, p-doping said second layer of cladding, and further wherein an n-doped layer is disposed between said contact layer and said second layer of cladding.

14. A laser according to claim 1 wherein said current confinement means comprise p-doping said contact layer, p-doping said second layer of cladding, and further wherein a highly resistive layer is disposed between said contact layer and said second layer of cladding.

15. A laser according to claim 14 wherein said highly resistive layer comprises low temperature growth GaAs.

* * * * *